US009699367B2

United States Patent
Koguchi et al.

(10) Patent No.: US 9,699,367 B2
(45) Date of Patent: Jul. 4, 2017

(54) IMAGING DEVICE AND METHOD FOR DISPLAYING MULTIPLE OBJECTS OF AN IMAGING VIEW

(71) Applicant: FUJIFILM Corporation, Tokyo (JP)

(72) Inventors: Takehiro Koguchi, Saitama (JP); Junji Hayashi, Saitama (JP); Yoichi Iwasaki, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 59 days.

(21) Appl. No.: 14/645,067

(22) Filed: Mar. 11, 2015

(65) Prior Publication Data

US 2015/0201123 A1 Jul. 16, 2015

Related U.S. Application Data

(63) Continuation of application No. PCT/JP2013/074829, filed on Sep. 13, 2013.

(30) Foreign Application Priority Data

Sep. 19, 2012 (JP) ................................. 2012-205742

(51) Int. Cl.
*H04N 5/232* (2006.01)
*G06K 9/00* (2006.01)
(Continued)

(52) U.S. Cl.
CPC ........... *H04N 5/23212* (2013.01); *G02B 7/34* (2013.01); *G03B 13/18* (2013.01); *G03B 13/36* (2013.01);
(Continued)

(58) Field of Classification Search
CPC ........... H04N 5/23212; H04N 5/23216; H04N 5/23293; H04N 5/23219; H04N 5/3696;
(Continued)

(56) References Cited

U.S. PATENT DOCUMENTS 7,649,537 B2 * 1/2010 Campbell ................. G06T 1/20
345/502
8,885,089 B2 * 11/2014 Aoki ........................ G02B 7/34
348/208.12
(Continued)

FOREIGN PATENT DOCUMENTS

JP 9-214813 A 8/1997
JP 2001-309210 A 11/2001
(Continued)

OTHER PUBLICATIONS

International Search Report issued in PCT/JP2013/074829, mailed on Dec. 17, 2013.
(Continued)

*Primary Examiner* — Nhan T Tran
*Assistant Examiner* — Chan Nguyen
(74) *Attorney, Agent, or Firm* — Birch, Stewart, Kolasch & Birch, LLP

(57) ABSTRACT

An imaging device includes an imaging lens, a generation device, a display device, a generation control device, and a display control device configured to control the display device to display the first display image generated by the generation device and display the second display image generated by the generation device in a display region of the first display image, and to display the second display image in a position corresponding to the main object image in the first display image when the main object image is detected by the detection device, wherein the detection device can detect an eye position in the main object image, and when the eye position is detected by the detection device, the generation control device controls the generation device to generate a division image that divides the main object image with the eye position as a boundary from the first and second images.

11 Claims, 25 Drawing Sheets

(51) Int. Cl.
*H04N 5/369* (2011.01)
*G02B 7/34* (2006.01)
*G03B 13/36* (2006.01)
*G03B 17/18* (2006.01)
*G03B 13/18* (2006.01)

(52) U.S. Cl.
CPC ......... *G03B 17/18* (2013.01); *G06K 9/00228* (2013.01); *G06K 9/00604* (2013.01); *H04N 5/23216* (2013.01); *H04N 5/23219* (2013.01); *H04N 5/23293* (2013.01); *H04N 5/3696* (2013.01)

(58) Field of Classification Search
CPC ........... G06K 9/00228; G06K 9/00604; G03B 13/18; G03B 13/36; G03B 17/18; G02B 7/34
USPC .......................................................... 348/239
See application file for complete search history.

(56) References Cited

U.S. PATENT DOCUMENTS

| | | | |
|---|---|---|---|
| 9,113,071 B2 * | 8/2015 | Shiohara | H04N 5/23212 |
| 2005/0191047 A1 * | 9/2005 | Toji | H04N 5/23212 |
| | | | 396/111 |
| 2009/0153693 A1 | 6/2009 | Onuki et al. | |
| 2009/0153720 A1 | 6/2009 | Suzuki et al. | |
| 2011/0115893 A1 | 5/2011 | Hayashi | |
| 2012/0044402 A1 | 2/2012 | Yamaguchi et al. | |
| 2013/0070046 A1 * | 3/2013 | Wolf | H04N 7/144 |
| | | | 348/14.16 |

FOREIGN PATENT DOCUMENTS

| | | |
|---|---|---|
| JP | 2004-40740 A | 2/2004 |
| JP | 2004-212891 A | 7/2004 |
| JP | 2009-38749 A | 2/2009 |
| JP | 2009-147665 A | 7/2009 |
| JP | 2009-163220 A | 7/2009 |
| JP | 2009-232288 A | 10/2009 |
| JP | 2011-13682 A | 1/2011 |
| JP | 2011-13683 A | 1/2011 |
| JP | 2011-109427 A | 6/2011 |
| JP | 2012-044804 A | 3/2012 |

OTHER PUBLICATIONS

PCT/IPEA/409—Issued in PCT/JP2013/074829, completed on Dec. 10, 2014.
PCT/ISA/237—Issued in PCT/JP2013/074829, mailed on Dec. 17, 2013.
IPRP with English Translation, dated Mar. 19, 2015, in related application No. PCT/JP2013/074829.
Japanese Office Action issued in corresponding Japanese Patent Application No. 2014-536831 on Feb. 26, 2016, along with a partial English translation.
Japanese Decision of Refusal for Japanese Application No. 2014-536831, issued Sep. 27, 2016, with Machine translation.
Chinese Office Action and English Translation issued Mar. 15, 2017 for Chinese Application No. 201380048849.X.

* cited by examiner (A)  (B)

IMAGING DEVICE AND METHOD FOR DISPLAYING MULTIPLE OBJECTS OF AN IMAGING VIEW

CROSS-REFERENCE TO RELATED APPLICATIONS

This application is a Continuation of PCT International Application No. PCT/JP2013/074829 filed on Sep. 13, 2013, which claims priority under 35 U.S.C §119(a) to Japanese Patent Application No. 2012-205742 filed on Sep. 19, 2012. Each of the above application(s) is hereby expressly incorporated by reference, in its entirety, into the present application.

BACKGROUND OF THE INVENTION

Field of the Invention

The present invention relates to an imaging device that generates and displays an image for the confirmation of focusing, and a control method thereof.

Description of the Related Art

As a digital camera, there is a well-known one including a so-called manual focus mode in Which a photographer can manually perform focusing adjustment (which is also referred to as "focus adjustment"), besides automatic focus using a phase difference detection system or a contrast detection system.

As a digital camera including a manual focus mode, there is a well-known one that adopts a method in which a reflex mirror is installed so as to be able to perform focus adjustment while confirming an imaged object and a split microprism screen that displays a phase difference by visual observation is used, or a method of confirming the contrast by visual observation.

Meanwhile, in a digital camera in which a reflex mirror widespread in recent years is omitted, there is no method of confirming an object image while displaying a phase difference since the reflex mirror does not exist, and it cannot help relying on the contrast detection system. However, in this case, it is not possible to perform contrast display over the resolution of a display device such as an LCD, and it cannot help adopting a method of performing partial enlargement and performing display.

Therefore, in recent years, a split image (second display image) used for the confirmation of focusing is displayed in a live view image (which is also referred to as "through image") in order to facilitate work to perform focusing on an object by an operator at the manual focus mode. The split image is a result of dividing and displaying an image acquired by imaging object light subjected to pupil division, and indicates the phase difference of each image. Regarding a vertically divided split image, the upper and lower images of the split image are horizontally shifted when focusing is misadjusted. and the upper and lower images are not horizontally shifted in a state where focusing is adjusted. The photographer performs focusing by operating a manual focus ring such that the gap between the upper and lower images of the split image is removed.

In the digital camera described in Japanese Patent Application Laid-Open No. 2004-40740 (hereinafter referred to as PTL 1), an object image is taken in two measurement positions by moving a diaphragm in the direction vertical to the optical axis, and a split image is displayed in a live view image by the use of these two object images.

In the digital camera described in Japanese Patent Application Laid-Open No. 2001-309210 (hereinafter referred to as PTL 2), a value corresponding to the distance between the image surface of an object image and the light receiving surface of an imaging element is calculated as a shift amount, and a split image shifted in the right and left opposite directions according to this shift amount is displayed in a live view image.

The digital camera described in Japanese Patent Application Laid-Open No. 2009-147665 and Japanese Patent Application Laid-Open No. 2009-163220 (hereinafter respectively referred to as PTL 3 and PTL 4) include an imaging element formed by arraying a normal pixel for photographing and two kinds of phase difference pixels for the detection of focusing to receive object light subjected to pupil division on an imaging surface. This digital camera generates a photographed image on the basis of an output signal from the normal pixel and performs live view image display, and generates a split image on the basis of the output from each of two kinds of phase difference pixels and displays it in a live view image.

SUMMARY OF THE INVENTION

Meanwhile, it is general that a split image is displayed on a specific region in a live view image, for example, on a central region, and so on. Therefore, in the digital cameras described in above-mentioned PTLs 1 to 4, in a case where focusing is requested to be adjusted to a main object such as person's face by manual focus operation, there is a problem that focus adjustment is difficult unless this main object is in the position across the boundary of the upper and lower images of a split image (see FIG. 14).

Moreover, in recent years, there is known a digital camera that enables the change of the display position of a split image in a live view image. However, in such a digital camera, since the user has to perform operation to move the split image in response to the position of the main object, it takes time and labor for this movement operation.

It is an object of the present invention to provide an imaging device and a control method thereof that can easily focus a main object such as a face when manual focus using an image for the confirmation of focusing such as a split image is performed.

An imaging device to achieve the object of the present invention includes: an imaging lens; a generation device configured to generate a first display image based on an image signal output from an imaging element having first and second pixel groups in which an object image passing through first and second regions in the imaging lens is pupil-divided and formed, and to generate a second display image used for confirmation of focusing from first and second images based on first and second image signals output from the first and second pixel groups; a display device configured to display at least any one of the first and second display images; a detection device configured to detect a specific main object image from the first display image; a generation control device configured to control the generation device to generate a division image that divides the main object image into plural from the first and second images when the main object image is detected by the detection device, and generate the second display image based on the division image; and a display control device configured to control the display device to display the first display image generated by the generation device and display the second display image generated by the generation device in a display region of the first display image, and to display the second display image in a position corresponding to the main object image in the first display image when the main object image is detected by the detection device.

According to the present invention, the second display image based on the position and size of the main object image can be displayed in the display region of the first display image.

It is preferable that: the imaging element includes the first and second pixel groups and a third pixel group into which an object image passing through the first and second regions enters without pupil division; and the generation device generates the first display image from an output of the third pixel group. By this means, it is possible to manually perform focus adjustment while seeing the object image formed with the output of the third pixel group.

It is preferable that: the detection device can detect an eye position in the main object image; and, when the eye position is detected by the detection device, the generation control device controls the generation device to generate a division image that divides the main object image with the eye position as a boundary from the first and second images. By this means, it is possible to focus the eye position of the main object.

It is preferable that the display control device displays a first object identification frame that encloses the second display image in the display region, based on a detection result of the detection device. By this means, it becomes easy to understand the position of the main object image in the second display image and the boundary of the second display image.

It is preferable that the display control device displays a translucent second object identification frame that encloses the main object image in the second display image, based on a detection result of the detection device. By this means, it becomes easy to understand the position of the main object image in the second display image and the boundary of the second display image.

It is preferable that the display control device displays a third object identification frame that encloses the main object image in the second display image and has a transparent part across a boundary between the first and second images, based on a detection result of the detection device. By this means, it becomes easy to understand the position of the main object image in the second display image and the boundary of the second display image.

It is preferable that: the detection device detects the main object image from each of the first and second images; and the display control device displays a fourth object identification frame that encloses both a region corresponding to the main object image in the first image and a region corresponding to the main object image in the second image in the first display image, in the second display image, based on a detection result of the main object image from the first and second images by the detection device. By this means, since the object identification frame is prevented from being displayed on the main object image in the display region of the second display image, it becomes easy to understand the boundary of the main object image in this display region.

It is preferable that: the second display image is displayed in a specific region in the display region; and, when the main object image locates outside the specific region, based on a detection result of the detection device, the display control device enlarges and displays the main object image in the display device. By this means, even in a case where the main object image is detected outside the specific region, it is possible to focus the main object.

It is preferable that, when the main object image is not detected by the detection device, the display control device displays the second display image in a specific region in the display region.

It is preferable that the specific region is a central region of the display region.

It is preferable that the detection device detects person's face as the main object Image.

It is preferable that: the imaging lens includes a focus lens; a lens movement mechanism that moves the focus lens in an optical axis direction of the imaging lens in response to focus operation is included; and the focus operation includes manual operation.

Moreover, a control method of an imaging device of the present invention includes: a generation step of generating a first display image based on an image signal output from an imaging element having first and second pixel groups in which an object image passing through first and second regions in the imaging lens is pupil-divided and formed, and generating a second display image used for confirmation of focusing from first and second images based on first and second image signals output from the first and second pixel groups; a detection step of detecting a specific main object image from the first display image; a generation control step of generating a division image that divides the main object image into plural from the first and second images in the generation step When the main object image is detected in the detection step, and generating the second display image based on the division image; and a display control step of controlling a display unit to display the first display image generated in the generation step and display the second display image generated in the generation step in a display region of the first display image, and displaying the second display image in a position corresponding to the main object image in the first display image when the main object image is detected in the detection step.

In a case where a specific main object image is detected, since the imaging device and control method thereof of the present invention generate multiple division images dividing the main object from first and second images and display a second display image generated on the basis of these division images on a position corresponding to the main object image in the first display image, the photographer can focus the main object more easily than the related art when the main object is focused by manual focus adjustment.

DETAILED DESCRIPTION OF THE PREFERRED EMBODIMENTS

[Digital Camera of First Embodiment]

Figure 1:
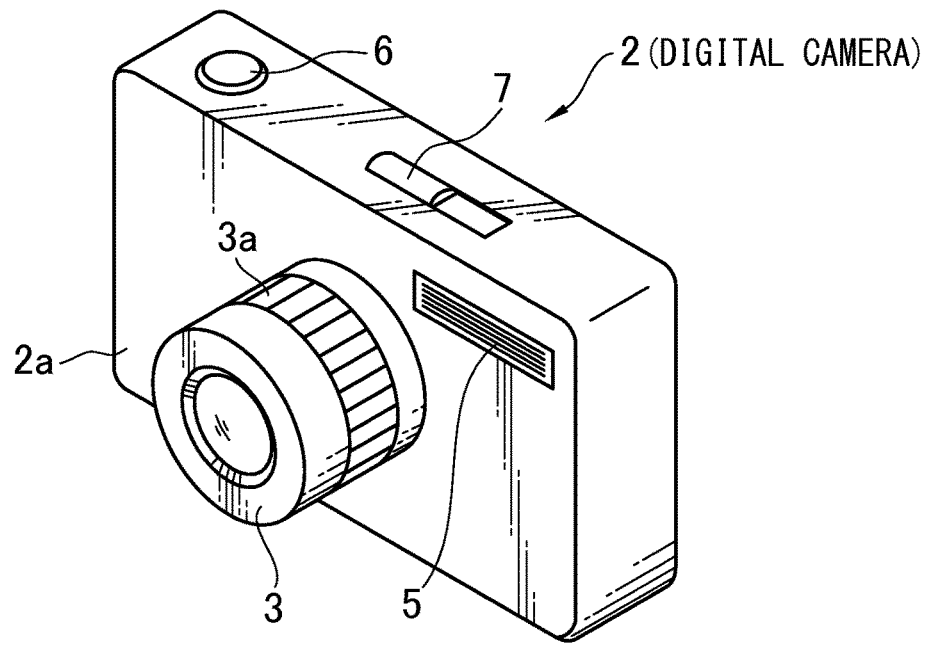
FIG. 1 is a front perspective view of a digital camera.

As illustrated in FIG. 1, a digital camera 2 corresponds to an imaging device of the present invention. A lens barrel 3 and a stroboscopic light emission unit 5, and so on, are installed on the front surface of a camera main body 2a of this digital camera 2. A shutter button 6 and a power supply switch 7, and so on, are installed on the upper surface of the camera main body 2a. A focus ring (lens movement mechanism) 3a used for manual focus (which is simply referred to as "MF" below) operation corresponding to the manual operation of the present invention is rotatably attached to the outer peripheral surface of a lens barrel 3

Figure 2:
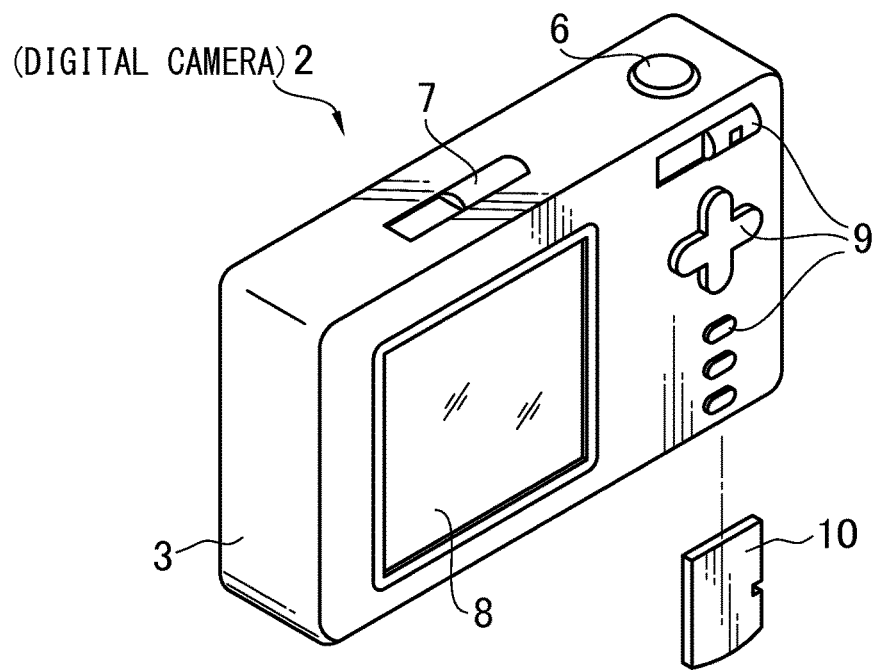
FIG. 2 is a back perspective view of a digital camera.

As illustrated in FIG. 2, a display unit (display device) 8 and an operation unit 9 are installed on the back surface of the camera main body 2a. The display unit 8 functions as an electronic viewfinder in a photographing standby state and displays a live view image (which is also referred to as "through image"). Moreover, in the display unit 8 at the time of image reproduction, an image is reproduced and displayed on the basis of image data recorded in a memory card 10.

The operation unit 9 is formed with a mode switching switch, a cross key and an execution key, and so on. The mode switching switch is operated when the operation mode of the digital camera 2 is switched. The digital camera 2 has a photographing mode that takes an image of an object and acquires a photographing image, and a reproduction mode that reproduces and displays the photographing image, and so on. Moreover, the photographing mode includes air AF mode to perform automatic focus (hereinafter simply referred to as "AF") and an MF mode to perform MF operation.

The cross key and the execution key are operated when: a menu screen and a setting screen are displayed on the display unit 8; a cursor displayed in these menu screen and setting screen is moved; and various settings of the digital camera 2 are fixed.

A card slot to which the memory card 10 is loaded and a loading lid that opens and closes the opening of this card slot are installed on the bottom surface of the camera main body 2a though illustration thereof is omitted.

Figure 3:
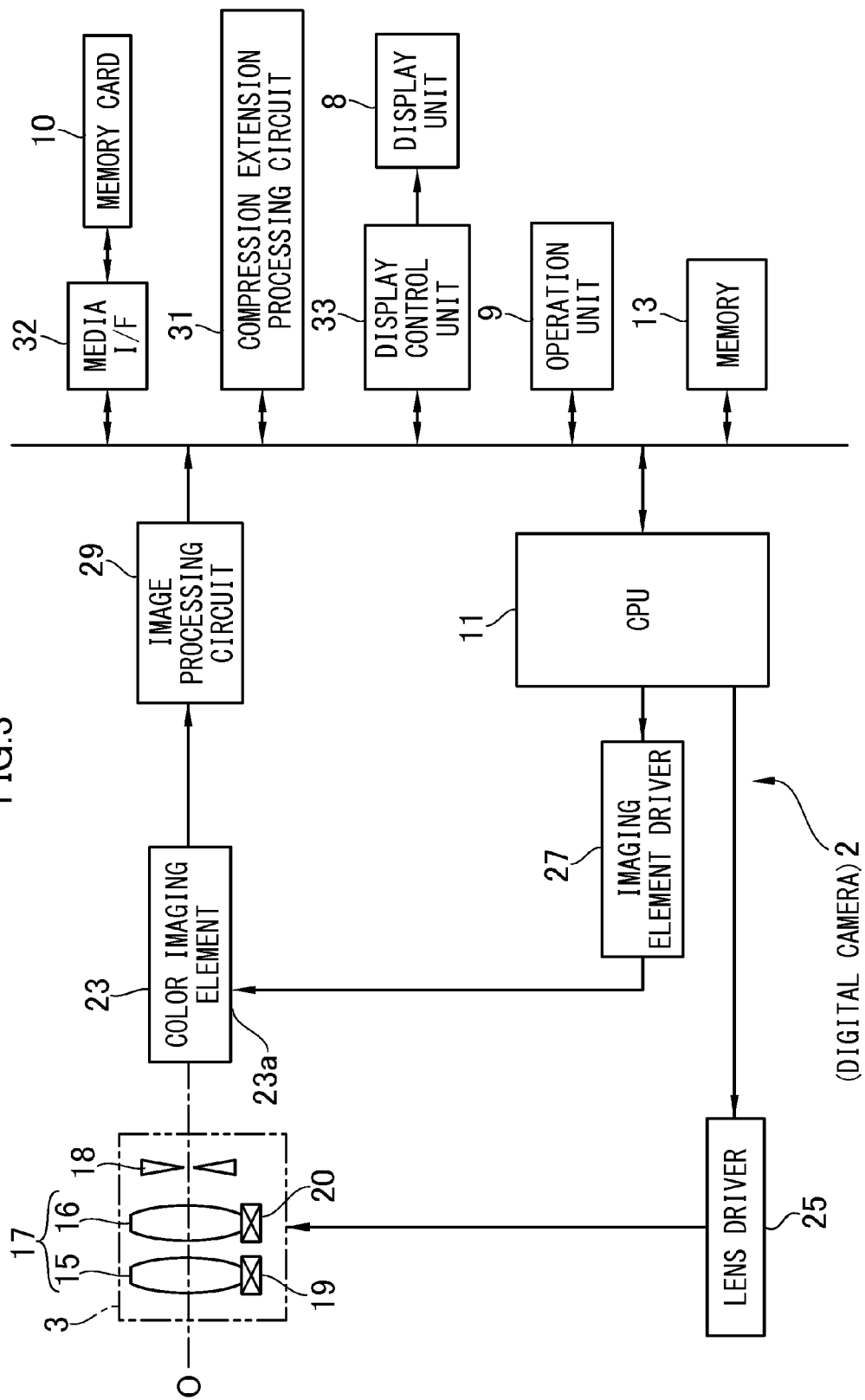
FIG. 3 is a block diagram illustrating an electrical configuration of a digital camera.

As illustrated in FIG. 3, a CPU 11 (generation control device) of the digital camera 2 sequentially executes various kinds of programs and data read out from a memory 13 on the basis of a control signal from the operation unit 9, and integrally controls each part of the digital camera 2. Here, the RAM region of the memory 13 functions as a work memory in which the CPU 11 performs processing, or temporary storage destination of various kinds of data.

A photographing lens 17 including a zoom lens 15 and a focus lens 16, and a mechanical shutter 18, and so on, are incorporated in the lens barrel 3. The zoom lens 15 and the focus lens 16 are driven by a zoom mechanism 19 and a focus mechanism 20 respectively and moved back and forth along optical axis O of the photographing lens 17. The zoom mechanism 19 and the focus mechanism 20 are configured with a gear and a motor, and so on. Moreover, the focus mechanism 20 is connected with the focus ring 3a through an unillustrated gear. Therefore, the focus mechanism 20 moves the focus lens 16 along the direction of optical axis O (hereafter referred to as "optical axis direction") according to the rotation operation (focus operation) of the focus ring 3a at the MF mode.

The mechanical shutter 18 has a moving element (whose illustration is omitted) that moves between a closing position that prevents object light from entering into a color imaging element 23 and an opening position that allows the object light to enter. The mechanical shutter 18 opens/blocks an optical path from the photographing lens 17 to the color imaging element 23 by moving the moving element to each position. Moreover, the mechanical shutter 18 includes a diaphragm that controls the light quantity of object light entered into the color imaging element 23. The mechanical shutter 18, the zoom mechanism 19 and the focus mechanism 20 are subjected to operation control by the CPU 11 through a lens driver 25.

The color imaging element 23 is disposed behind the mechanical shutter 18. The color imaging element 23 converts the object light having passed the photographing lens 17, and so on, into an electrical output signal and outputs it. Here, as the color imaging element 23, it is possible to use various kinds of imaging elements such as a CCD (Charge Coupled Device) imaging element and a CMOS (Complementary Metal Oxide Semiconductor) imaging element. An imaging element driver 27 controls the drive of the color imaging element 23 under the control of the CPU 11.

An image processing circuit (generation device) 29 generates object image data (which is also referred to as "photographing image data") by applying various kinds of processing such as gradation conversion, white balance correction and γ correction processing to the output signal from the color imaging element 23. Moreover, the image processing circuit 29 generates split image data for MF operation besides the object image data at the MF mode. The object image data and the split image data are temporarily stored in the VRAM region of the memory 13 (it is acceptable if a VRAM is separately installed). The VRAM region has a live view image memory area that stores an image of two consecutive fields, and sequentially overwrites and stores each data.

A compression extension processing circuit 31 performs compression processing on the object image data stored in the VRAM region when the shutter button 6 is subjected to press operation. Moreover, the compression extension processing circuit 31 applies extension processing to compressed image data acquired from the memory card 10 through a media I/F 32. The media I/F 32 performs recording and reading, and so on, of object image data with respect to the memory card 10.

At the photographing mode, a display control unit 33 reads out the object image data and split image data stored in the VRAM region and outputs them to the display unit 8. Moreover, at the reproduction mode, the display control unit 33 outputs photographing image data extended in the compression extension processing circuit 31 to the display unit 8.

<Configuration of Color Imaging Element>

Figure 4:
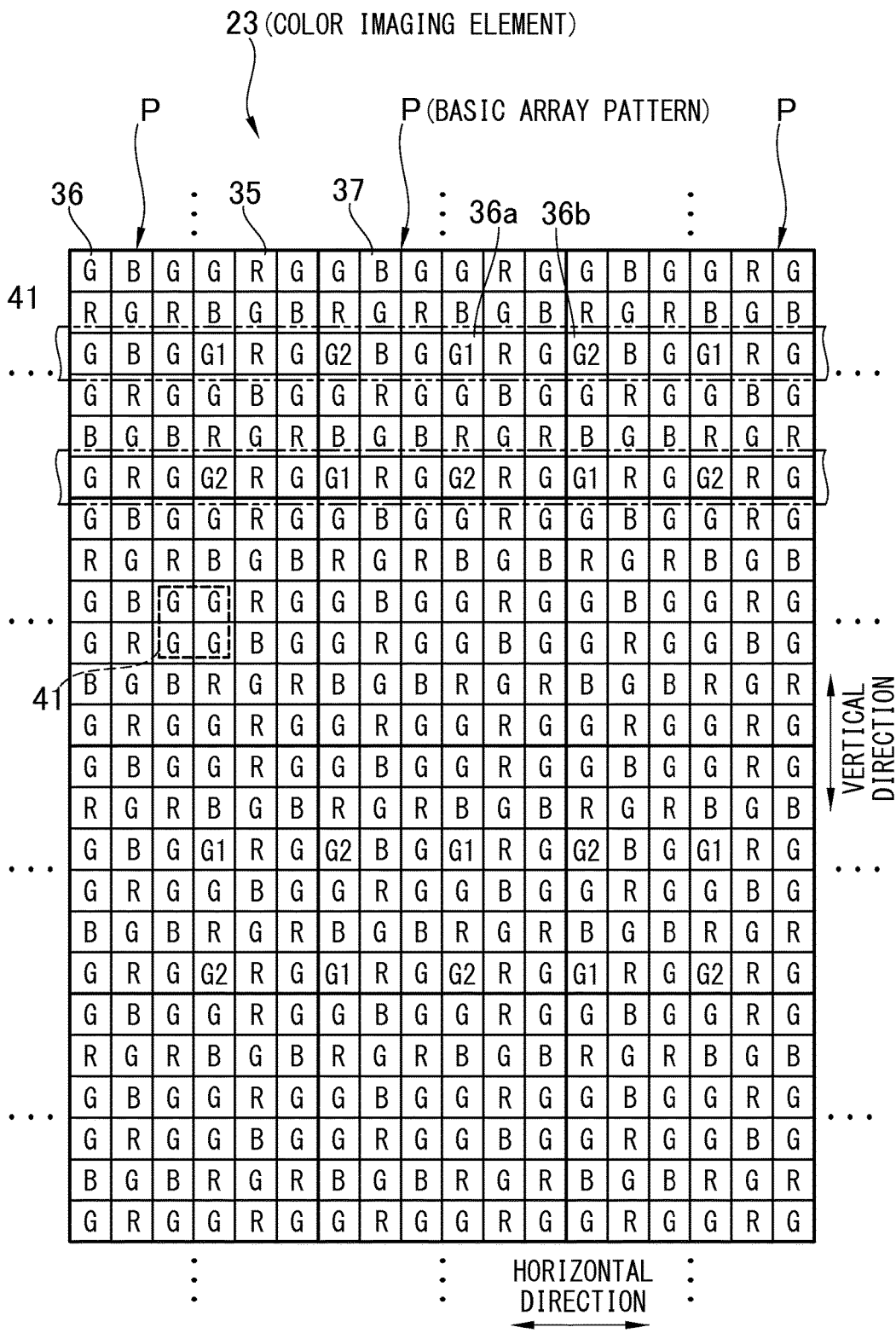
FIG. 4 is a schematic diagram of an imaging surface of a color imaging element.

As illustrated in FIG. 4, on the imaging surface of the color imaging element 23, an R pixel 35 of red (R), a G pixel 36 of green (G) and a B pixel 37 of blue (B) are two-dimensionally disposed. RGB pixels 35 to 37 correspond to the third pixel group of the present invention and include a photoelectric conversion element 39 (see FIG. 5) and a color filter 40 of any of three primary colors disposed above the photoelectric conversion element 39 (see FIG. 5). Color filters 40 of the R color, G color and B color are installed on respective photoelectric conversion elements 39 of the RGB pixels 35 to 37. Here, "on" and "above" indicate the direction from a semiconductor substrate 45 to a microlens 49 in FIG. 5 (upper direction in the figure).

The color filter array (pixel array) of the color imaging element 23 has following features (1), (2), (3), (4), (5). and (6).

[Feature (1)]

The color filter array includes basic array pattern P formed with a square array pattern corresponding to 6×6 pixels, and this basic array pattern P is repeatedly disposed in the horizontal direction and the vertical direction. Since the color filters 40 of RGB are arrayed with predetermined periodicity in this way, as compared with a known random array in the related art, it is possible to perform processing according to a repetitive pattern when pixel interpolation processing (which may be referred to as "synchronization processing" or "demosaicing processing") or the like of R, G, and B signals read out from the color imaging element 23 is performed. Moreover, in a case where an image is reduced by thinning processing in units of basic array pattern P, it is possible to use a common processing circuit by making a color filter array after the thinning processing identical to a color filter array before the thinning processing.

[Feature (2)]

As for the color filter array, one or more color filters of the G color corresponding to a color that contributes most to acquire a luminance signal (G color in this embodiment) are disposed in respective filter lines in the horizontal, vertical and oblique directions (oblique upper right and oblique lower left directions and oblique lower right and oblique upper left directions) of the color filter array. By this means, it is possible to improve the reproduction accuracy of pixel interpolation processing in a high frequency region.

[Feature (3)]

As for basic array pattern P, the percentage of the pixel number of the G pixel 36 is larger than the percentages of respective pixel numbers of the R pixel 35 and B pixel 37 of other colors. By this means, aliasing at the time of pixel interpolation processing is suppressed and the high frequency reproducibility improves.

[Feature (4)]

As for the color filter array, one or more color filters 40 of the R color and B color corresponding to other colors of two or more colors than the G color (R and B colors in this embodiment) are disposed in respective lines in the horizontal and vertical directions of the color filter array in basic array pattern P. By this means, it is possible to reduce the occurrence of false colors (color moire). As a result, it is possible to prevent an optical low-pass filter to suppress the occurrence of false colors from being disposed in an optical path from the incident surface of the photographing lens 17 to the imaging surface, or, even in a case where the optical low-pass filter is applied, it is possible to apply the one whose function to cut the high frequency component to prevent the occurrence of false colors is weak. Therefore, it is possible not to deteriorate the resolution.

[Feature (5)]

The color filter array includes a square array 41 corresponding to 2×2 G pixels 36 in which the G color the color filter 40 is installed. By extracting such 2×2 G pixels 36 and calculating the difference absolute value of the pixel values of the G pixels 36 in the horizontal direction, the difference absolute value of the pixel values of the G pixels 36 in the vertical direction and the difference absolute value of the pixel values of the G pixels 36 in the oblique direction, it is possible to determine that there is a correlation in a direction in which the difference absolute value is small among the horizontal direction, the vertical direction and the oblique direction. That is, according to this color filter array, it is possible to determine a direction with a high correlation among the horizontal direction, the vertical direction and the oblique direction, by the use of information on the G pixels 36 of the minimum pixel interval in the square array 41. This direction determination result can be used for pixel interpolation processing.

[Feature (6)]

Basic array pattern P is point-symmetrical against the center. Moreover, four 3×3 subarrays in basic array pattern P are point-symmetrical against the color filter 40 of the G color at respective centers. By such symmetric property, it becomes possible to reduce and simplify the circuit size of a subsequent processing circuit.

[Phase Difference Pixel]

On a partial region (for example, central region) of the imaging surface of the color imaging element 23, a first phase difference pixel 36a (displayed with "G1" in the figure) and a second phase difference pixel 36b (displayed with "G2" in the figure) are installed instead of part of the G pixels 36. The first and second phase difference pixels 36a and 36b correspond to the first pixel group and second pixel group of the present invention.

A first array pattern 42 and second array pattern 43 that include first and second phase difference pixels 36a and 36b are repeatedly disposed at predetermined pixel intervals (12-pixel intervals in this example) in the vertical direction (second direction) on the imaging surface of the color imaging element 23. In the first array pattern 42, the first phase difference pixel 36a and the second phase difference pixel 36b are alternately arrayed at predetermined pixel intervals (three-pixel intervals in this example) in the horizontal direction (first direction). The second array pattern 43 is formed by shifting the first array pattern 42 by the above-mentioned predetermined pixel intervals in the horizontal direction.

Figure 5:
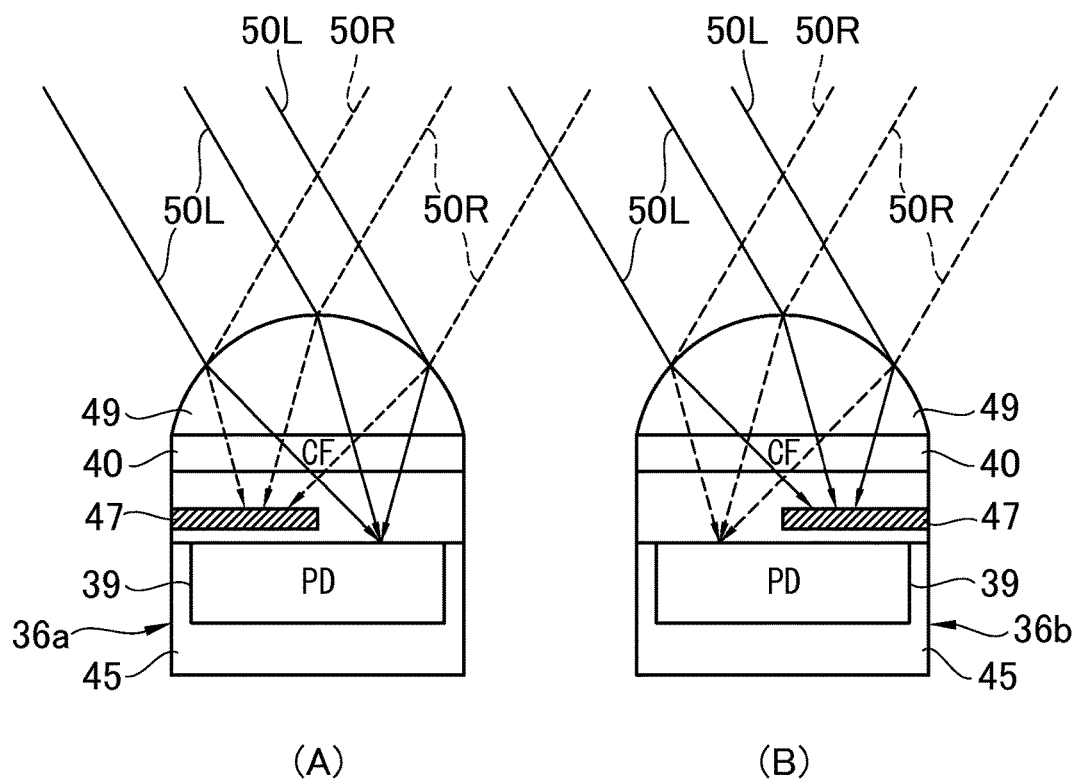
FIG. 5 is a cross--sectional view of first and second phase difference pixels.

In part (A) part of FIG. 5 and part (B) of FIG. 5 in which the cross sections of the first and second phase difference pixels 36a and 36b are illustrated, the photoelectric conversion element 39 is formed in a matrix manner on the surface layer of the semiconductor substrate 45 of the color imaging element 23. Here, various circuits used for the drive or signal output of each pixel are installed in the semiconductor substrate 45 though illustration thereof is omitted.

A light shielding film 47 is installed on each photoelectric conversion element 39. The light shielding film 47 is installed so as to cover the left half region (which is simply referred to as "left region" below) of the photoelectric conversion element 39 of the first phase difference pixel 36a in the figure and cover the right half region (which is simply referred to as "right region" below) in the second phase difference pixel 36b in the figure. By this means, only the right region of the photoelectric conversion element 39 of the first phase difference pixel 36a is exposed and only the left region of the photoelectric conversion element 39 of the second phase difference pixel 36b is exposed. Here, the light shielding film 47 is not installed on the photoelectric conversion elements 39 of the RGB pixels 35 to 37 though illustration thereof is omitted.

The color filter 40 is installed on the light shielding film 47 through an unillustrated flattening layer, and so on. The color filter 40 of the G color is installed in positions corresponding to the first and second phase difference pixels 36a and 36b. Moreover, the color filters 40 of respective colors of R, G and B are installed in positions respectively corresponding to the pixels 35 to 37 of respective colors of R, G and B though illustration thereof is omitted.

The microlens 49 is installed on the color filters 40 of respective colors. Here, various layers such as a flat layer with transmittance may be installed between the color filter 40 and the microlens 49.

Object light 50L (which displayed by solid lines in the figure and is an object image of the present invention) that enters into the microlens 49 on the first phase difference pixel 36a from the left oblique direction in the figure is concentrated (formed) on the right region of the photoelectric conversion element 39 by the microlens 49. By contrast, since object light 50R (which is displayed by dotted lines in the figure and is an object image of the present invention) that enters into the microlens 49 in the right oblique direction in the figure is shielded by the light shielding film 47, it is not concentrated on the left region of the photoelectric conversion element 39.

Moreover, the object light 50R that enters into the microlens 49 on the second phase difference pixel 36b is concentrated (formed) on the left region of the photoelectric conversion element 39 by the microlens 49. By contrast, since the object light 50L that enters into the microlens 49 is shaded by the light shielding film 47, it is not concentrated on the right region of the photoelectric conversion element 39.

Figure 6:
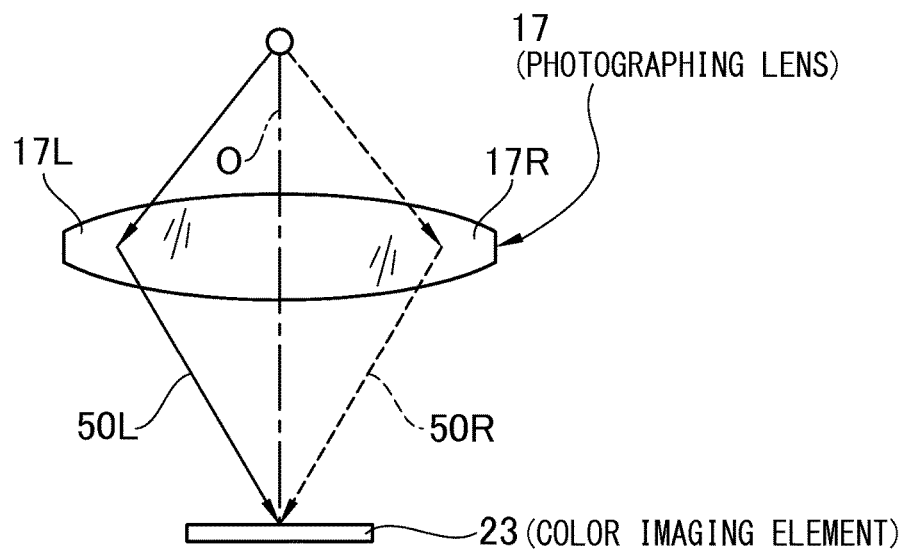
FIG. 6 is an explanatory diagram to describe object light that enters into a color imaging element.

As illustrated in FIG. 6, the object light 50L and the object light 50R pass through a left region 17L and right region 17R of the photographing lens 17 (zoom lens 15 and focus lens 16) respectively. Here, both lenses 15 and 16 are integrally illustrated to prevent the drawing from being complicated.

Returning to FIG. 5, when the object light that enters into the color imaging element 23 is pupil-divided by the light shielding film 47, the first phase difference pixel 36a has high sensibility with respect to the object light 50L, and, by contrast, the second phase difference pixel 36b has high sensibility with respect to the object light 50R. Here, the light shielding film 47 functions as a pupil division unit that performs pupil division in the present embodiment, but, for example, the position of the microlens 49 may be deviated.

Moreover, the object light 50R that enters into the microlens 49 on the RGB pixels 35 to 37 is concentrated on the left region of the photoelectric conversion element 39 and the object light 50L is concentrated on the right region of the photoelectric conversion element 39 though illustration thereof is omitted. Therefore, the RGB pixels 35 to 37 have high sensibility with respect to both the object light 50L and the object light 50R.

<Configuration of Image Processing Circuit>

Figure 7:
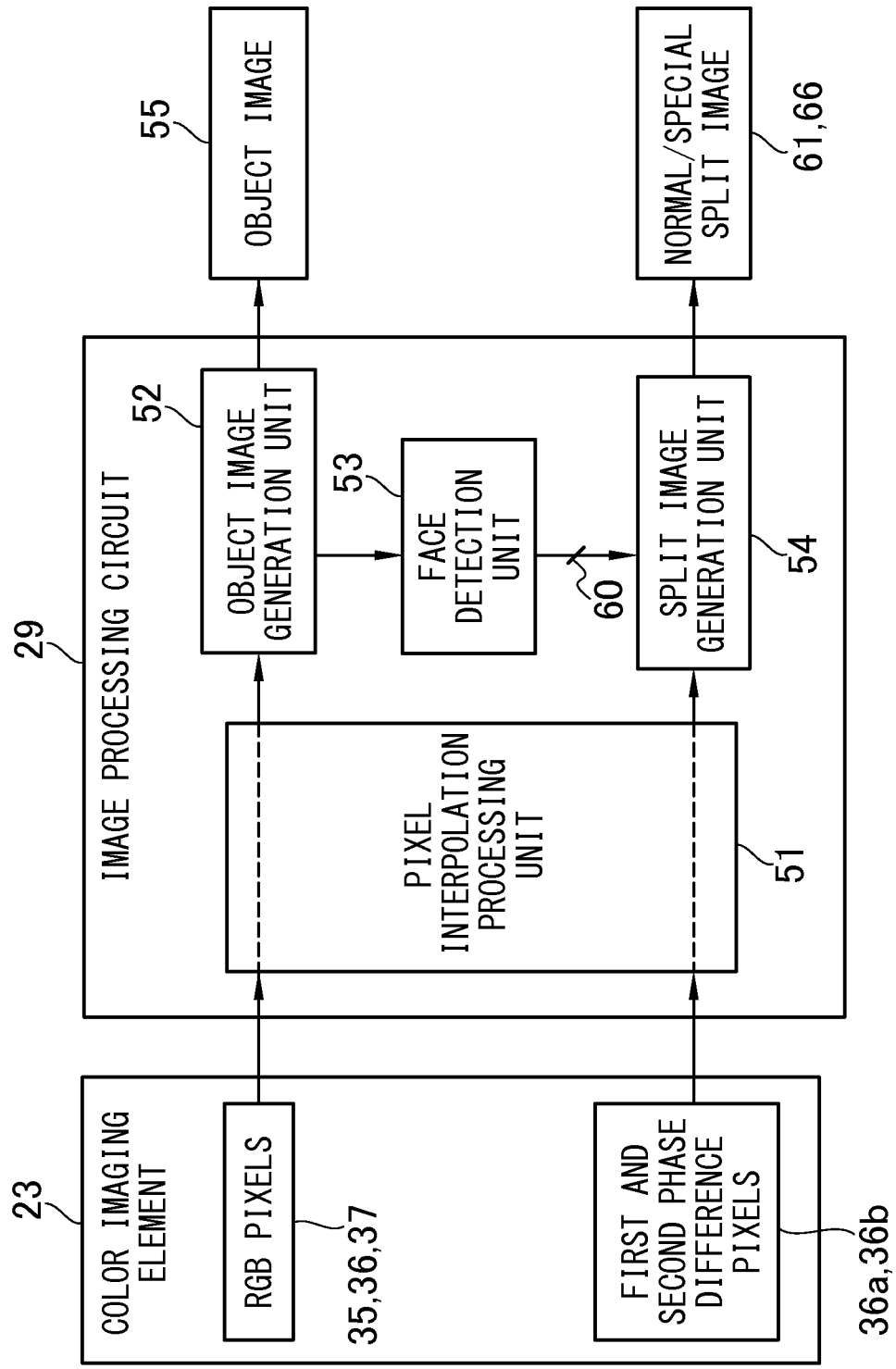
FIG. 7 is a functional block diagram of an image processing circuit of the first embodiment.

As illustrated in FIG. 7, the image processing circuit (generation device) 29 includes a pixel interpolation processing unit 51 and an object image generation unit (object image generation device) 52 and a face detection unit (detection device) 53 and a split image generation unit 54.

The pixel interpolation processing unit 51 calculates the pixel values of Interpolation pixels in the positions of both of the phase difference pixels 36a and 36b on the basis of the pixel value of a G pixel 36 located in the periphery of the first and second phase difference pixels 36a and 36b. The pixel value of the interpolation pixel of this G pixel 36 is output to the object image generation unit 52.

Moreover, based on the pixel value of the first phase difference pixel 36a located in the periphery of the second phase difference pixel 36b, the pixel interpolation processing unit 51 calculates the pixel value of an interpolation pixel in the position of this second phase difference pixel 36b. In addition, based on the pixel value of the second phase difference pixel 36b located in the periphery of the first phase difference pixel 36a, the pixel interpolation processing unit 51 calculates the pixel value of an interpolation pixel in the position of this first phase difference pixel 36a. The pixel values of the interpolation pixels of these both phase difference pixels 36a and 36b are output to the split image generation unit 54.

The object image generation unit 52 generates full-color object image data 55 corresponding to the first display image of the present invention, on the basis of the pixel values (pixel signals) of the RGB pixels 35 to 37 and the pixel value of the interpolation pixel of the G pixel 36 at a photographing mode. This object image data 55 is temporarily stored in the VRAM region of the memory 13. Here, a YC conversion processing circuit (whose illustration is omitted) that converts the object image data 55 of RGB signals into luminance signal Y and color difference signals Cr and Cb is installed in the object image generation unit 52.

By performing face detection processing that analyzes the object image data 55 read from the VRAM region of the memory 13 and detects the face of person H (see FIG. 10) who is a main object from the object image data 55, the face detection unit 53 detects the position and size of a face image in this object image data 55. At this time, for example, a region in which both eyes of person H exist in the object image data 55 is specified. A known eye detection method using a Haar-like feature, and so on, is used for this identification. Further, when the region in which both eyes of person H exist is specified, the outline of the face is specified from the skin and hair colors of person H and the position relationship of these. By this means, the position of the face image is found and the size of the face image is found from the area of the skin color region. Moreover, when the size of the face image is found, it is possible to measure the interval between eyes and decide the size of the face from the measured interval between both eyes.

Here, various methods other than the above-mentioned method are known as a method of detecting the position and size of a face image in the object image data 55, and the position and size of the face image may be detected using various known methods. The face detection unit 53 outputs the detection result of the position and size of the face image to the split image generation unit 54 as "face detection information 60". Here, in a case where a face image is not detected, the output of the face detection information 60 is not performed.

The split image generation unit 54 generates monochrome split image data (second display image) used for the confirmation of focusing, on the basis of the pixel values (image signals) of the both phase difference pixels 36a and 36b, the pixel values of interpolation pixels of the both phase difference pixels 36a and 36b and face detection information input from the face detection unit 53.

<Normal Generation Mode>

Figure 8:
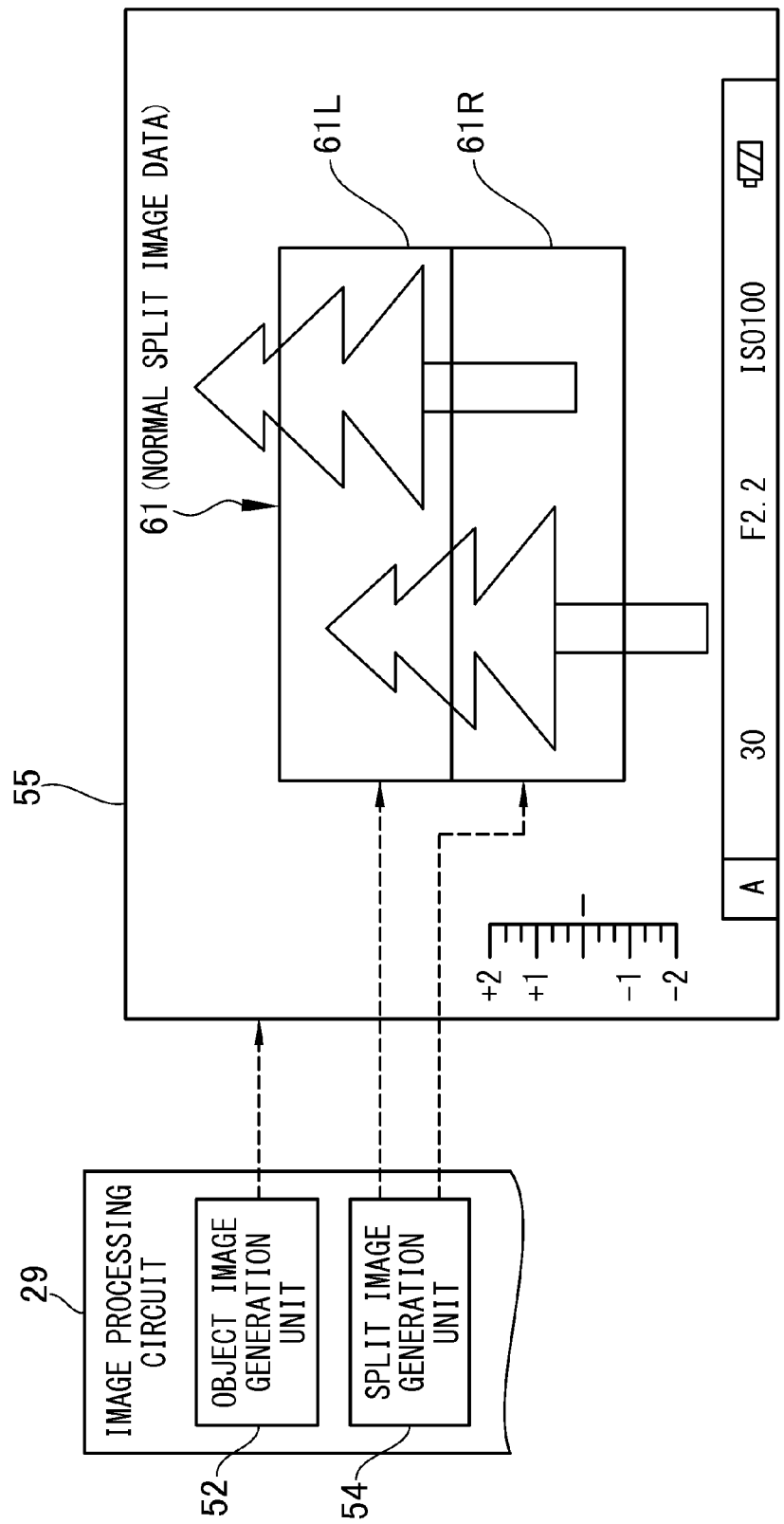
FIG. 8 is an explanatory diagram to describe split image data at focusing of a normal generation mode.
Figure 9:
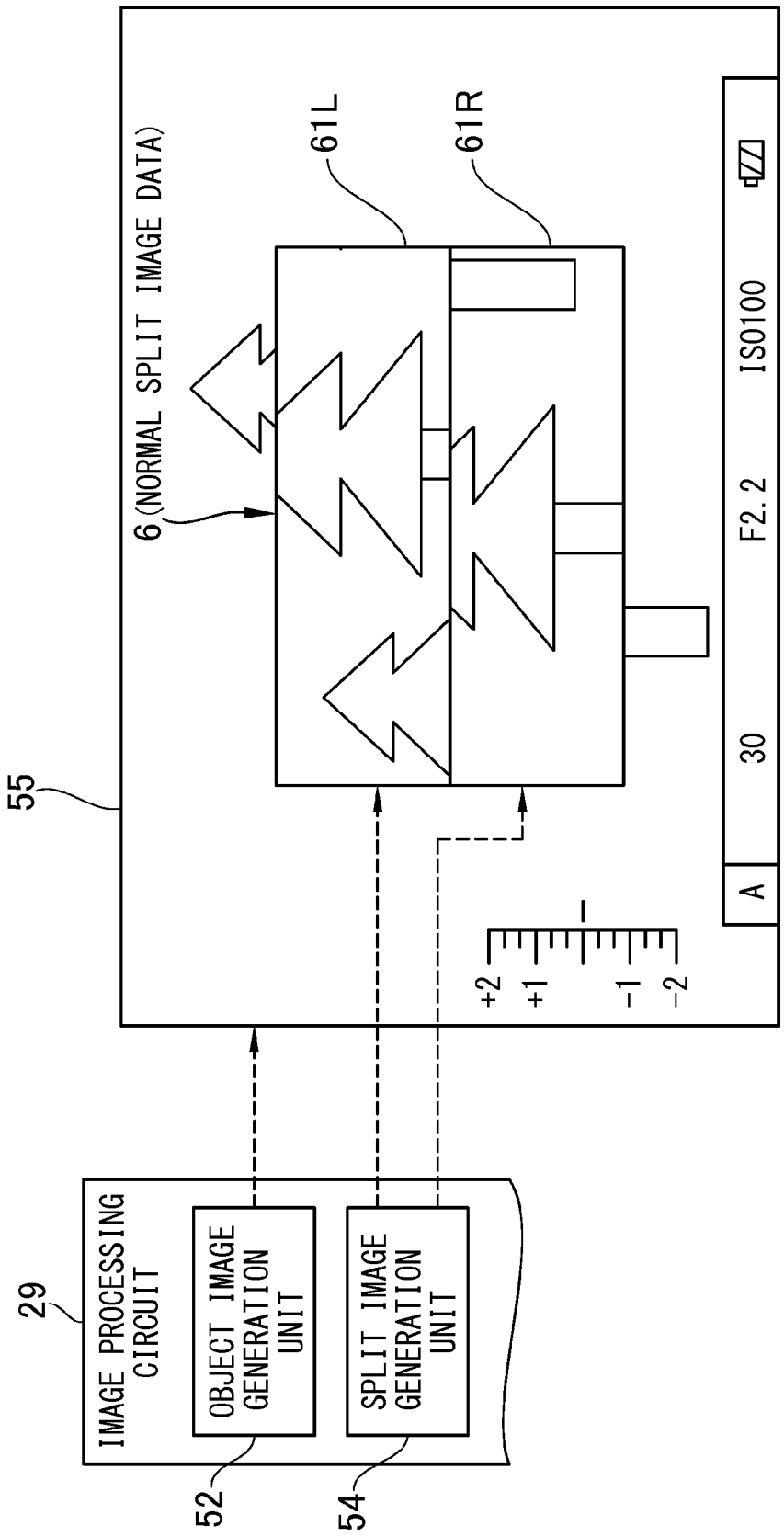
FIG. 9 is an explanatory diagram to describe split image data a at non-focusing of it normal generation mode.

As illustrated in FIGS. 8 and 9, the split image generation unit 54 performs operation in a normal generation mode in a case where the face detection information 60 is not input from the face detection unit 53, under the control of a CPU 11. The split image generation unit 54 in this case generates monochrome first image data 61L when the upper half region of the central region of the object image in the figure is seen from the L viewpoint side, on the basis of the luminance components of the pixel values of each first phase difference pixel 36a and the interpolation pixel thereof.

Moreover, the split image generation unit 54 generates monochrome second image data 61R when the lower half region of the central region of the object image in the figure is seen from the R viewpoint side, on the basis of the luminance components of the pixel values of each second phase difference pixel 36b and the interpolation pixel thereof. By this means, monochrome normal split image data (which is abbreviated as normal SI data below) 61 including the first image data 61L and the second image data 61R is acquired. Here, the normal SI data 61 is synthesized with the object image data 55 so as to be able to easily understand the image of the normal SI data 61 in the figure, and this synthesis is performed in a display control unit 33. The normal SI data 61 is temporarily stored in the VRAM region of the memory 13.

The first image data 61L and the second image data 61R that form the upper and lower images of the normal SI data 61 are shifted in the right and left directions in the figure according to the focusing state of a focus lens 16. The shift amount between both image data 61L and 61R corresponds to the shift amount in the focus of the focus lens 16, and, when the focus lens 16 is focused, the shift amount between the both image data 61L and 61R becomes 0 (including "almost 0") (see FIG. 8). Moreover, as the focus of the focus lens 16 is shifted, the shift amount between the both image data 61L and 61R becomes larger (see FIG. 9).

<Special Generation Mode>

Figure 10:
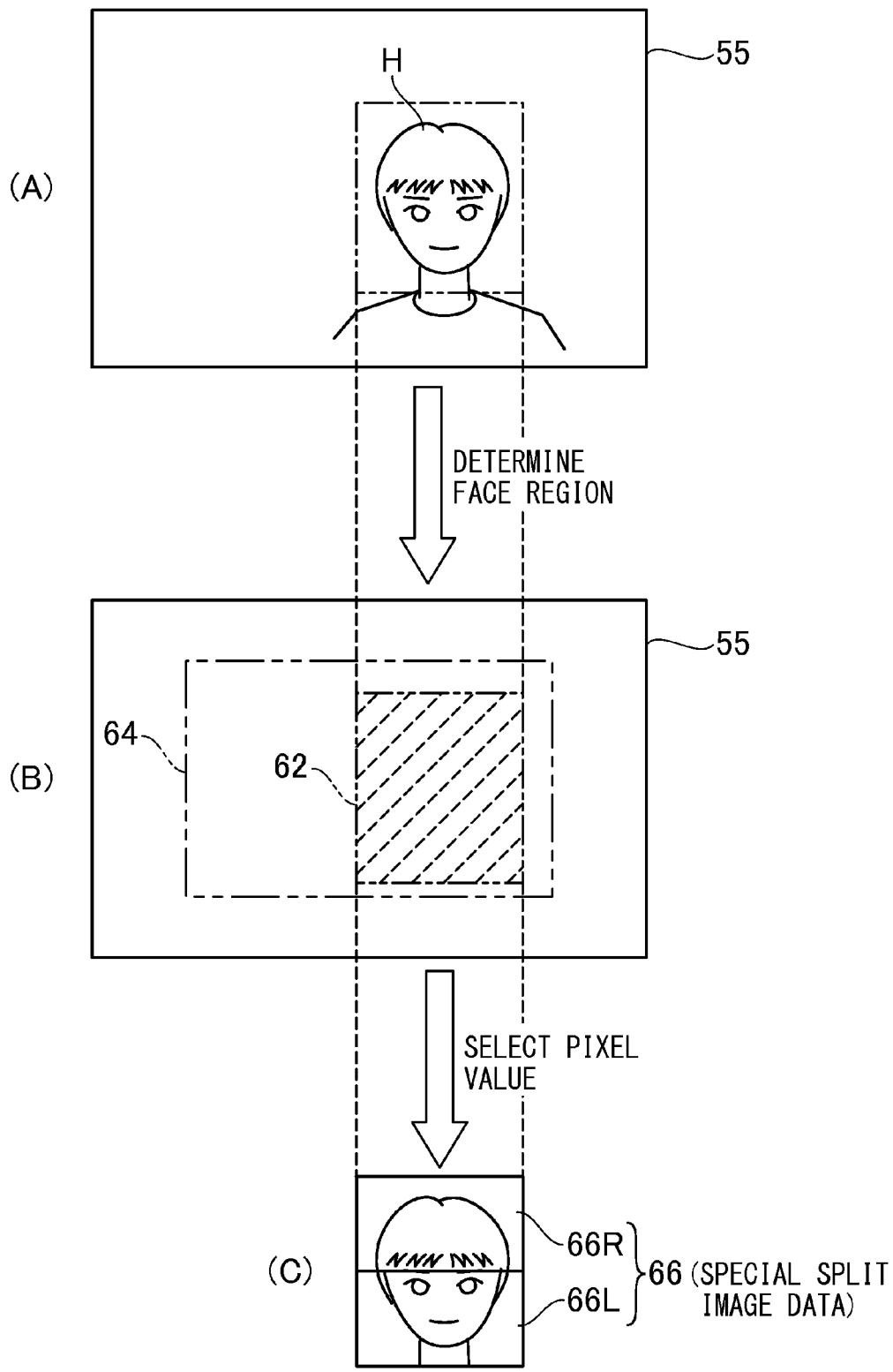
FIG. 10 is an explanatory diagram to describe generation processing of special SI data.

As illustrated in FIG. 10, the split image generation unit 54 performs operation in a special generation mode in a case where the face detection information 60 is input from the face detection unit 53, under the control of the CPU 11. The split image generation unit 54 in the special generation mode determines the position and size of a region 62 of a face image (which is simply referred to as "face region" below) in the object image data 55 on the basis of the face detection information 60 (see part (A) of FIG. 10 and part (B) of FIG. 10). This face region 62 corresponds to the main object image of the present invention, and denotes a region in which the position and the size change according to the face detection result. Meanwhile, reference numeral 64 in the figure designates the central region (which is a specific region of the present invention) of the display region of the object image data 55 (live view image), and the normal SI data 61 mentioned above is displayed on this central region 64. This central region 64 is a fixed region corresponding to the disposition region of the both phase difference pixels 36a and 36b in the imaging surface of the color imaging element 23.

Next, the split image generation unit 54 selects pixels forming the upper image of upper and lower images (division images) formed by vertically dividing the face region 62 from each first phase difference pixel 36a and the interpolation pixel thereof, and generates first image data 66L on the basis of the luminance component of the pixel value of each of these pixels. Moreover, the split image generation unit 54 selects pixels forming the lower image of the above-mentioned upper and lower images from each second phase difference pixel 36b and the interpolation pixel thereof, and generates second image data 66R on the basis of the luminance component of the pixel value of each of these pixels. By this means, monochrome special split image data 66 (which is abbreviated as special SI data below) including the first image data 66L and the second image data 66R is acquired.

The special SI data 66 generated by the split image generation unit 54 is temporarily stored in the VRAM region of the memory 13. At this time, face region position information indicating the position of the face region 62 determined by the split image generation unit 54 is stored in the header or the like of the special SI data 66.

Here, various adjustment circuits that perform offset subtraction and gain adjustment are installed in the split image generation unit 54 though illustration is omitted.

Returning to FIG. 3, the display control unit (display control device) 33 reads the object image data 55 and the normal SI data 61 from the VRAM region of the memory 13 in the normal generation mode, and, after synthesizing the normal SI data 61 with the central region 64 of the object image data 55, outputs the result to the display unit 8. By this means, as illustrated in FIGS. 8 and 9, a live view image in which a monochrome split image based on the normal SI data 61 is synthesized with the central region of a full color image based on the object image data 55 is displayed on the display unit 8.

Meanwhile, after reading the object image data 55 and the special SI data 66 from the VRAM region of the memory 13 in the special generation mode, the display control unit 33 refers to face region position information stored in the header or the like of the special SI data 66. By this means, the position of the face region 62 in the object image data 55 is determined.

Figure 11:
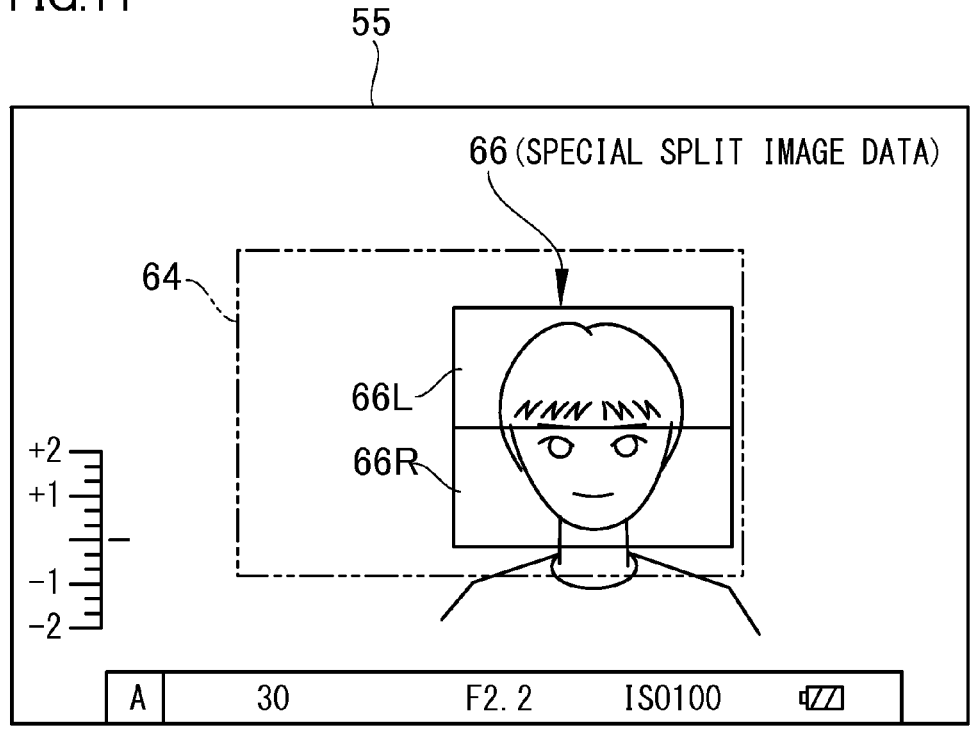
FIG. 11 is an explanatory diagram to describe split image data at focusing of a special generation mode.
Figure 12:
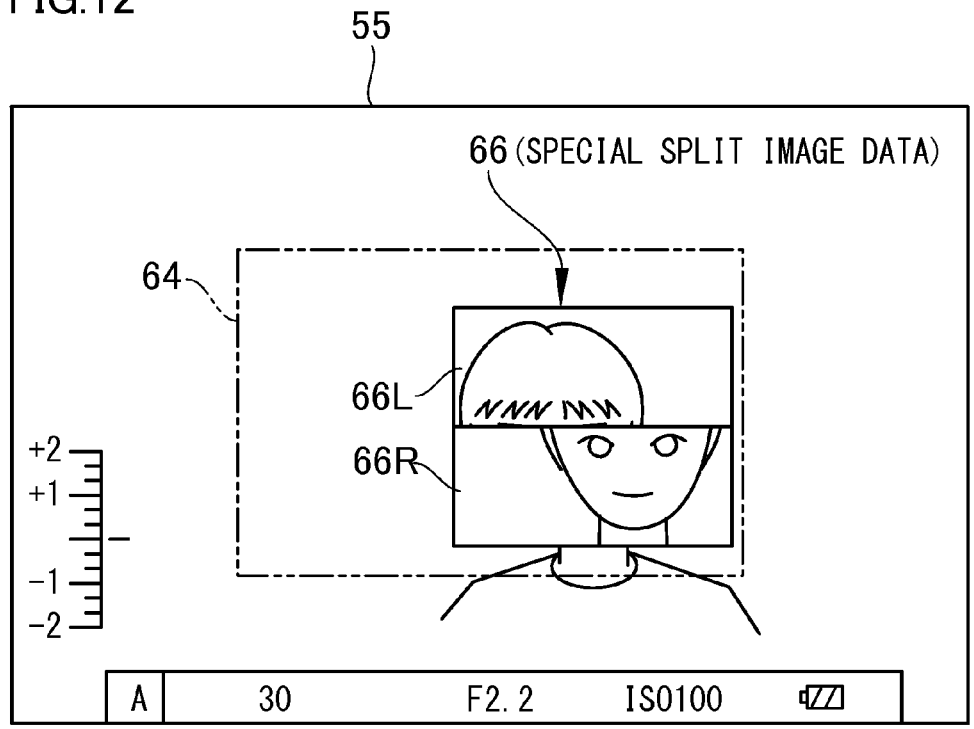
FIG. 12 is an explanatory diagram to describe split image data at non-focusing of a special generation mode.

Next, as illustrated in FIGS. 11 and 12, after synthesizing the special SI data 66 with the face region 62 of the object image data 55, the display control unit 33 outputs the result to the display unit 8. By this means, a live view image in which a monochrome split image based on the special SI data 66 is synthesized in a full color image based on the object image data 55 is displayed on the display unit 8. Similar to the normal generation mode, the shift amount of the upper and lower images (both image data 66L and 66R) of the split image at the time of focusing becomes 0 (including "almost 0") (see FIG. 11). Moreover, the shift amount between the upper and lower images becomes larger as the focus of the focus lens 16 is shifted (see FIG. 12).

<Other Components>

Here, an AF detection circuit for AF is installed in the digital camera 2 though illustration thereof is omitted. The AF detection circuit calculates a focus adjustment amount (which is also referred to as "defocus amount") by analyzing an image formed with an output of the first phase difference pixel 36a and an image formed with an output of the second phase difference pixel 36b and detecting the shift direction of both images and the shift amount between both images. Based on this focus adjustment amount, the CPU 11 performs focus adjustment by driving the focus lens 16 by the lens driver 25 and the focus mechanism 20. Since AF processing of such a phase difference system is known, specific explanation thereof is omitted here.

<Operation of Digital Camera of First Embodiment>

Figure 13:
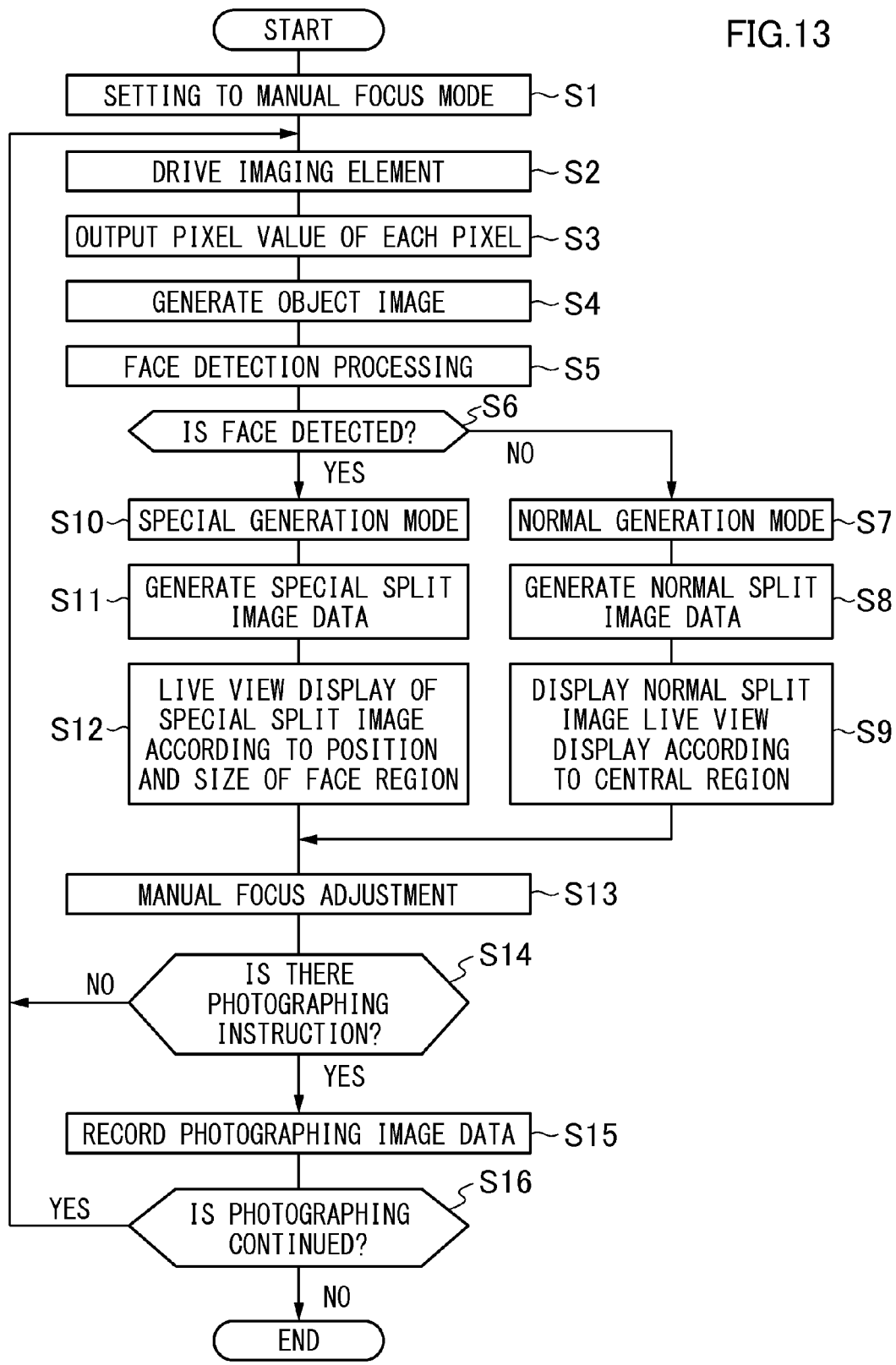
FIG. 13 is a flowchart illustrating the flow of photographing processing of a digital camera of the first embodiment.

Next, the operation of a digital camera 2 of the above-mentioned configuration is described using FIG. 13. When MF operation is performed, the digital camera 2 is set to the MF mode in the operation unit 9 (step S1). When it is set to the MF mode, the CPU 11 controls the operation of a mechanical shutter 18 through a lens driver 25 and drives the color imaging element 23 through an imaging element driver 27 (step S2). Here, since the operation of the digital camera 2 in a case where the AF mode is set is known, a specific explanation is omitted here.

After the pixel values (outputs) of the RGB pixels 35 to 37 of the color imaging element 23 are output to the image processing circuit 29, they are input in the object image generation unit 52 together with the pixel value of the interpolation pixel of the G pixel 36 subjected to interpolation processing in the pixel interpolation processing unit 51. Moreover, similarly, after the pixel values of the first and second phase difference pixels 36a and 36b are output to the image processing circuit 29, they are input in the split image generation unit 54 together with the pixel values of the interpolation pixels of the both phase difference pixels 36a and 36b subjected to interpolation processing in the pixel interpolation processing unit 51 (step S3).

The object image generation unit 52 generates the object image data 55 on the basis of the pixel values of the RGB pixels 35 to 37 and the interpolation pixel, and stores it in the VRAM region of the memory 13 (step S4).

The face detection unit 53 reads this object image data 55 from the VRAM region whenever new object image data 55 is stored in the VRAM region of the memory 13, and performs face detection processing (step S5). Further, in a case where a face image is included in the object image data 55, the face detection unit 53 detects the position and size thereof. The detection result by this face detection unit 53 is output to the split image generation unit 54 as the face detection information 60.

<Live View Display at Normal Generation Mode>

The split image generation unit 54 performs operation in a normal generation mode in a case where the face detection information 60 is not input from the face detection unit 53, under the control of the CPU 11 (NO in step S6, and step S7). The split image generation unit 54 generates the first image data 61L on the basis of the luminance components of the pixel values of each first phase difference pixel 36a and the interpolation pixel thereof, and generates the second image data 61R on the basis of the luminance components of the pixel values of each second phase difference pixel 36b and the interpolation pixel thereof. By this means, the normal SI data 61 including the first image data 61L and the second image data 61R is generated (step S8). This normal SI data 61 is stored in the VRAM region of the memory 13.

The display control unit 33 reads the object image data 55 and the normal SI data 61 from the memory 13, and, after synthesizing the normal SI data 61 with the central region 64 in the object image data 55, outputs the result to the display unit 8. By this means, as illustrated in FIGS. 8 and 9, a live view image in which the monochrome split image is synthesized with the central region 64 of the full color image is displayed on the display unit 8 (step S9).

<Live View Display at Special Generation Mode>

The split image generation unit 54 performs operation in the special generation mode in a case where the face detection information 60 is input from the face detection unit 53, under the control of the CPU 11 (YES in step S6, and step S10). First, the split image generation unit 54 determines the position and size of the face region 62 in the object image data 55 on the basis of the face detection information 60 as illustrated in part (A) of FIG. 10 and part (B) of FIG. 10.

Next, the split image generation unit 54 selects pixels forming the upper image (division image) of the upper and lower division of the face region 62 from each first phase difference pixel 36a and the interpolation pixel thereof, and generates the first image data 66L on the basis of the luminance component of the pixel value of each of these pixels. Moreover, the split image generation unit 54 selects pixels forming the lower image (division image) of the face region 62 from each second phase difference pixel 36b and the interpolation pixel thereof, and generates the second image data 66R on the basis of the luminance component of the pixel value of each of these pixels. By this means, monochrome special SI data 66 including the first image data 66L and the second image data 66R is acquired (step S11). This special SI data 66 is stored in the VRAM region of the memory 13. Moreover, face region position information is stored in the header or the like of the special SI data 66.

After reading the object image data 55 and the special SI data 66 from the VRAM region of the memory 13, the display control unit 33 refers to the face region position information stored in the header or the like of the special SI data 66. After synthesizing the special SI data 66 with the face region 62 of the object image data 55 on the basis of this reference result, the display control unit 33 outputs it to the display unit 8. By this means, a live view image in which the monochrome split image is synthesized with the face region 62 of the full color image is displayed on the display unit 8.

As illustrated in FIG. 12, the both image data 66L and 66R shift in the right and left directions in the figure according to the focusing state of the focus lens 16. Therefore, the user performs rotation operation of the focus ring 3a and moves the focus lens 16 along the optical axis direction. As the focus lens 16 becomes closer to the focusing position in which it is focused on the object, the shift amount between the both image data 66L and 66R gradually decreases. By this means, the user can perform focus adjustment while confirming the live view image.

When the focus lens 16 is set to the focusing position, the shift amount between the both image data 66L and 66R becomes 0. By this means, the focus lens 16 is focused on the object and the focus adjustment completes (step S13). In the following, the above-mentioned processing is repeatedly performed until a shutter button 6 is pressed and operated (NO in step S14).

When the shutter button 6 is pressed (YES in step S14), the object image data 55 for one frame is generated in the object image generation unit 52 and temporarily stored in the VRAM region of the memory 13. After this object image data 55 is compressed by a compression extension processing circuit 31, it is recorded in the memory card 10 through a media I/F 32 (step S15). In the following, the above-mentioned processing is repeatedly performed until the MF mode ends (step S16).

<Operation Effect of Digital Camera of First Embodiment>

Thus, in the present invention, live view display is performed by synthesizing the special SI data 66 corresponding to the position and size of the face region 62 in the object image data 55 with it. By this means, the live view display is performed in a state where the both image data 66L and 66R dividing a face image (split image) are horizontally shifted when the face of person H is not focused, regardless of the position of the face image of person H in the central region 64 (see FIG. 12).

Figure 14:
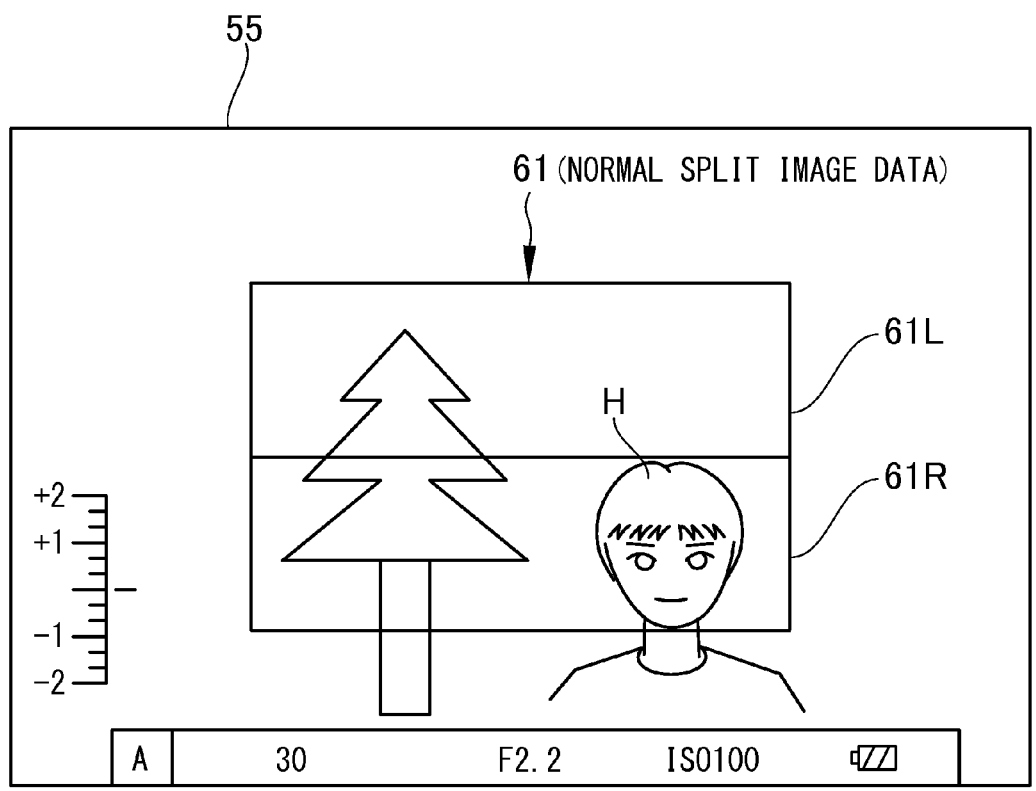
FIG. 14 is an explanatory diagram to describe split image data of a comparative example.

Meanwhile, in FIG. 14 illustrating a comparative example, in split image display in the related art, when a face image is in the upper side or lower side in the central region 64, this face image is located in the upper side or lower side from the boundary of the upper and lower images of the split image. As a result, it is difficult to focus the face image.

By contrast with this, since a split image suitable for the position and size of a face region detected by face detection is displayed in the present invention, it does not have to adjust framing such that the face image locates in the central region 64 of a live view image, and it does not have to manually move the position of the split image according to the position of the face image. As a result, it is possible to focus the face more easily than the related art.

[Digital Camera of Second Embodiment]

Figure 15:
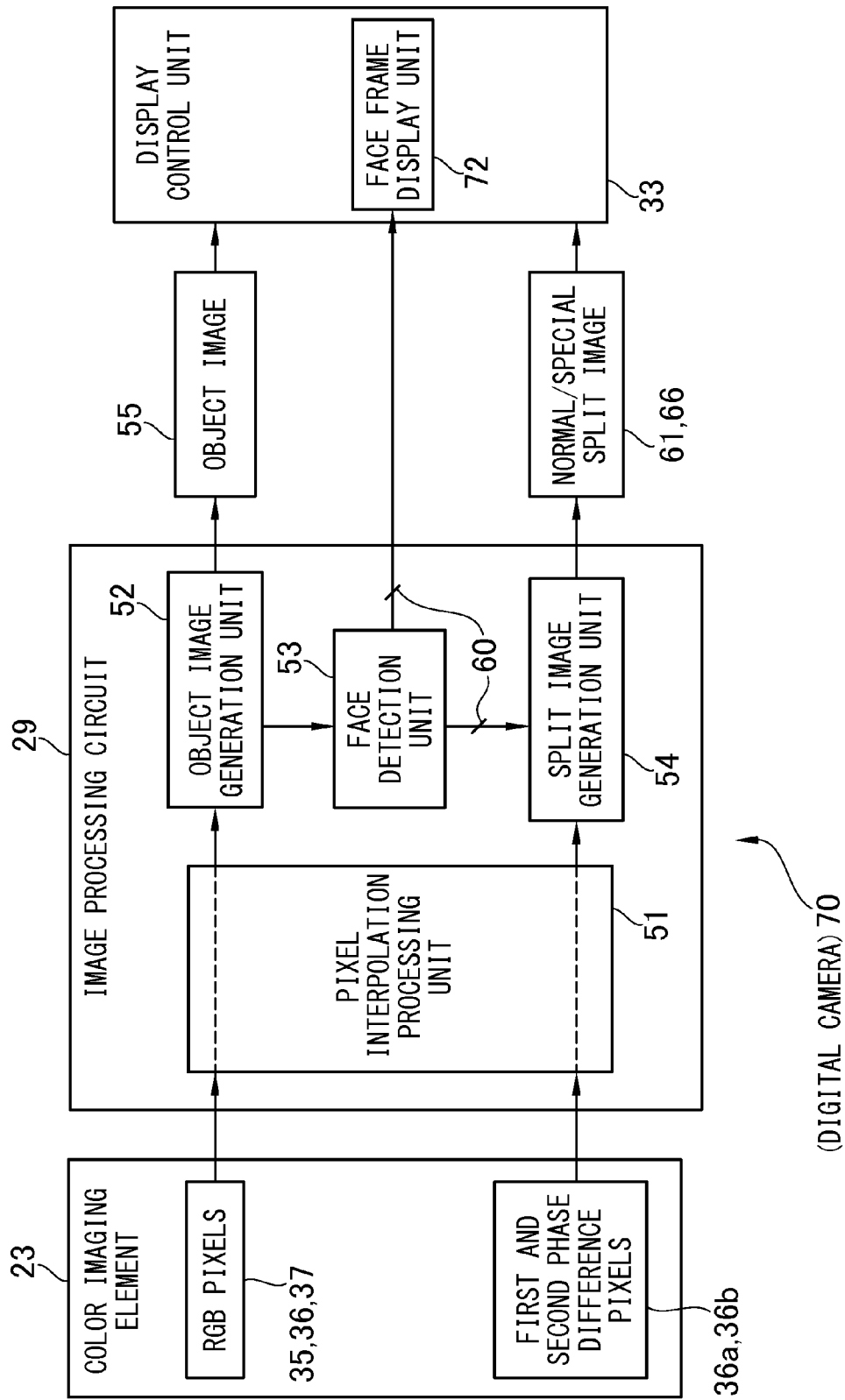
FIG. 15 is a block diagram illustrating the electrical configuration of a digital camera of the second embodiment.

Next, a digital camera 70 of the second embodiment of the present invention is described using FIG. 15. The identification display of a face image detected by the face detection unit 53 is not performed in the above-mentioned first embodiment, but the identification display of the face image detected by the face detection unit 53 is performed in the digital camera 70.

The digital camera 70 has basically the same configuration as the digital camera 2 of the first embodiment, except for that a face frame display unit 72 is installed in the display control unit 33 and the face detection unit 53 outputs the face detection information 60 even to the face frame display unit 72. Therefore, regarding what has the same function/configuration as the above-mentioned first embodiment, the same reference numeral is assigned and explanation thereof is omitted.

Figure 16:
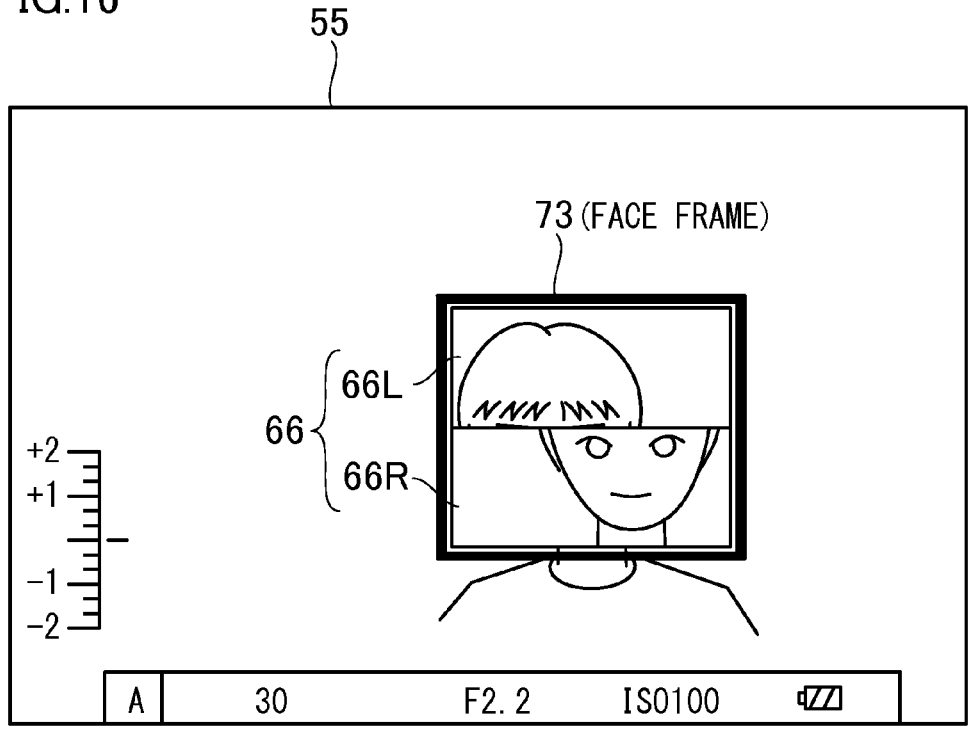
FIG. 16 is an explanatory diagram to describe face frame display of the second embodiment.

As illustrated in FIG. 16, the face frame display unit 72 convolutes and displays a face frame (first object identification frame) 73 that encloses the special SI data 66 (face region 62) in the display region of the object image data 55 by determining the face region 62 on the basis of the face detection information 60 acquired from the face detection unit 53. Such the face frame 73 is displayed for the following reason.

Figure 17:
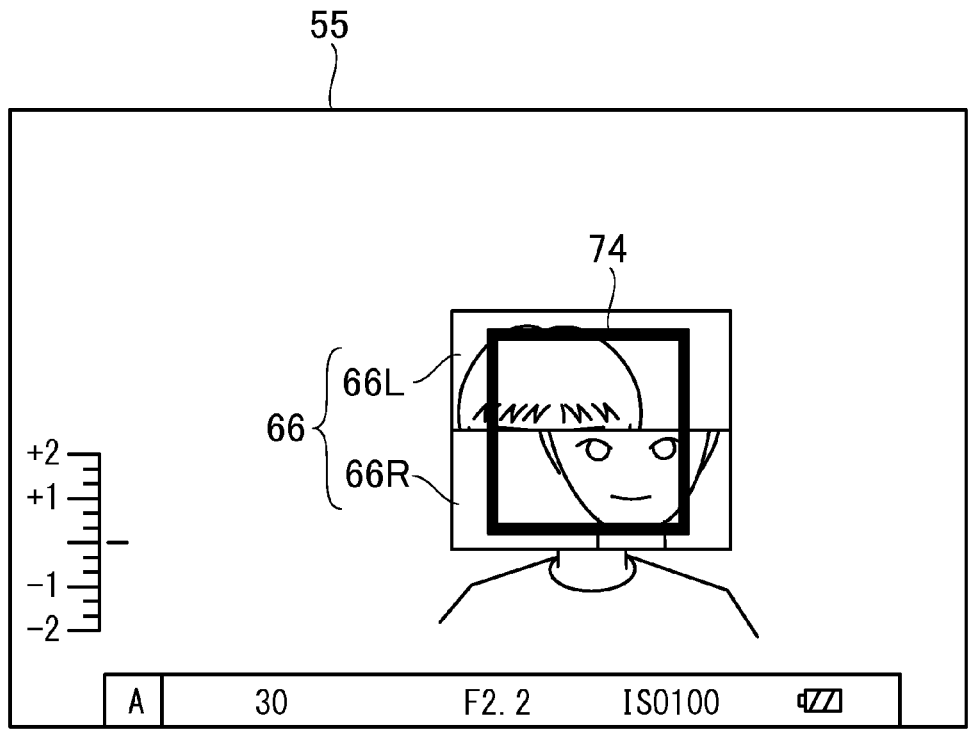
FIG. 17 is an explanatory diagram to describe face frame display of a comparative example.

In FIG. 17 illustrating a comparative example, in a case where a face frame 74 is displayed in the special SI data 66 (face region 62), it is difficult to understand the position of the face in the special SI data 66. Moreover, since the face frame 74 overlaps with part of the boundary between the both image data 66L and 66R, it is difficult to understand the shift amount between the both image data 66L and 66R in this boundary. As a result, it becomes difficult to perform focus adjustment such that the gap between the both image data 66L and 66R becomes 0.

By contrast with this, in the digital camera 70 of the present invention, by displaying the face frame 73 so as to enclose the special SI data 66 (face region 62), it becomes easy to understand the position of the face in the special SI data 66. Moreover, it becomes easy to understand the boundary between the both image data 66L and 66R. As a result, it is possible to easily perform focus adjustment even in a case where the face frame 73 is displayed.

[Digital Camera of Third Embodiment]

Figure 18:
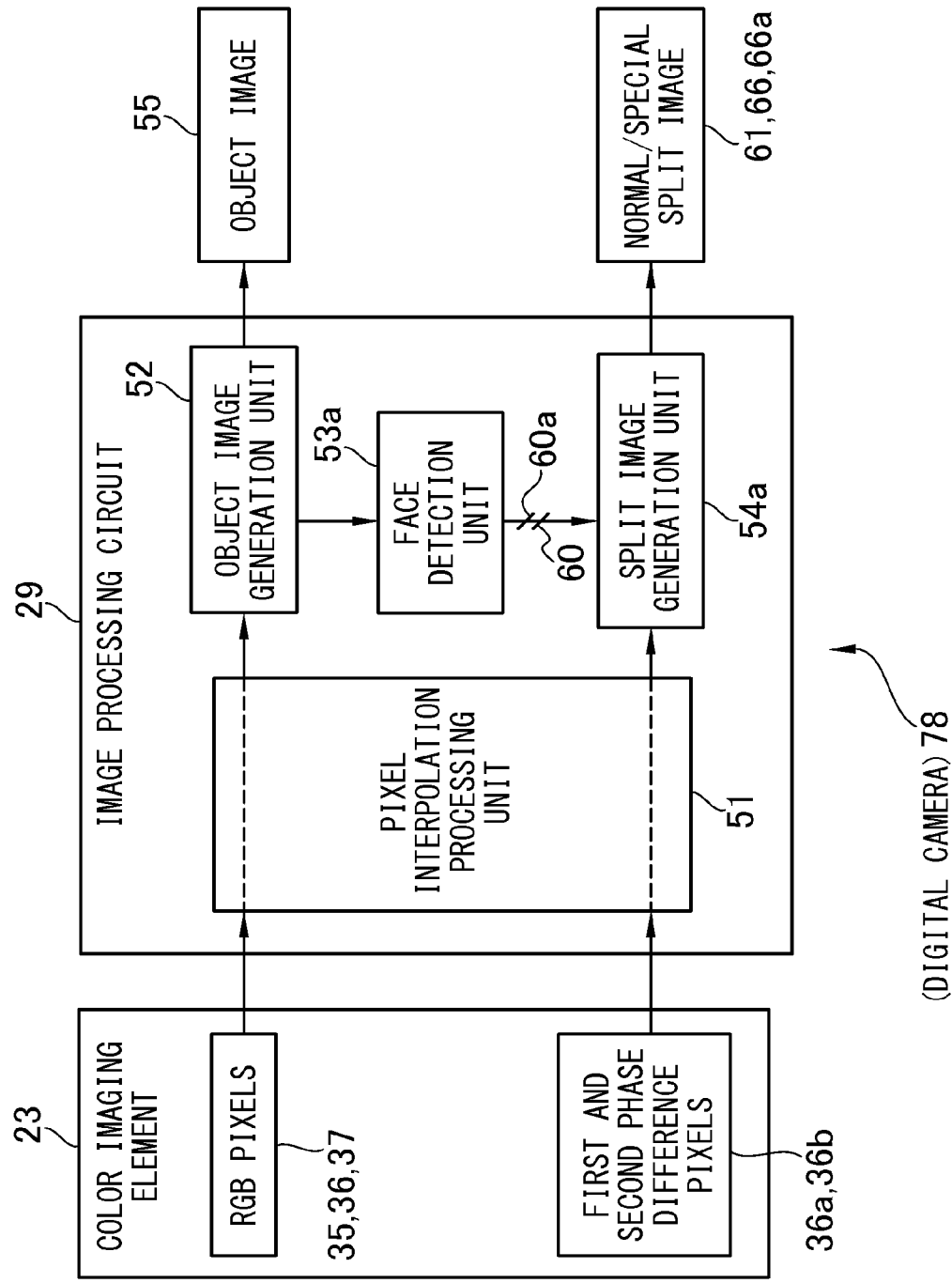
FIG. 18 is a block diagram illustrating the electrical configuration of a digital camera of the third embodiment.

Next, a digital camera 78 of the third embodiment of the present invention is described using FIG. 18. The position of the boundary between the both image data 66L and 66R forming the special SI data 66 is not especially decided in the cameras 2 and 70 of the above-mentioned first and second embodiments, but the eye position is set as the position of the boundary between the both image data 66L and 66R in the digital camera 78.

Here, the digital camera 78 has basically the same configuration as the above-mentioned first embodiment, except for that a face detection unit 53a and a split image generation unit 54a are installed instead of the face detection unit 53 and the split image generation unit 54 of the first embodiment. Therefore, regarding what has the same function/configuration as the above-mentioned first embodiment, the same reference numeral is assigned and explanation thereof is omitted.

The face detection unit 53a is basically the same as the above-mentioned face detection unit 53, but, in a case where the eyes of person H are detected by eye detection performed at the time of face detection, information on the positions of these eyes is output to the split image generation unit 54a as "eye detection information 60a". Moreover, the face detection unit 53a performs face detection processing by the use of other known face detection methods than the eye detection method in a case where the eyes are not detected. In this case, only the face detection information 60 is output to the split image generation unit 54a.

The split image generation unit 54a is basically the same as the above-mentioned split image generation unit 54, and generates the special SI data 66 on the basis of the face detection information 60. However, in a case where the eye detection information 60a is input from the face detection unit 53a, the split image generation unit 54a decides the positions of eyes based on this eye detection information 60a as the boundary between upper and lower images when the face region 62 is vertically divided. Further, the split image generation unit 54a selects the both phase difference pixels 36a and 36b and the interpolation pixels thereof respectively corresponding to the upper and lower images with the eye positions as the boundary, and generates first and second image data 66La and 66Ra (see FIG. 20) on the basis of the luminance component of each of these pixels. By this means, monochrome special SI data 66a with the eye positions as the boundary is acquired.

In a case where eyes are detected in the face detection unit 53*a*, the CPU 11 (generation control device) controls the split image generation unit 54*a* and performs generation of the special SI data 66*a*.

<Operation of Digital Camera of Third Embodiment>

Figure 19:
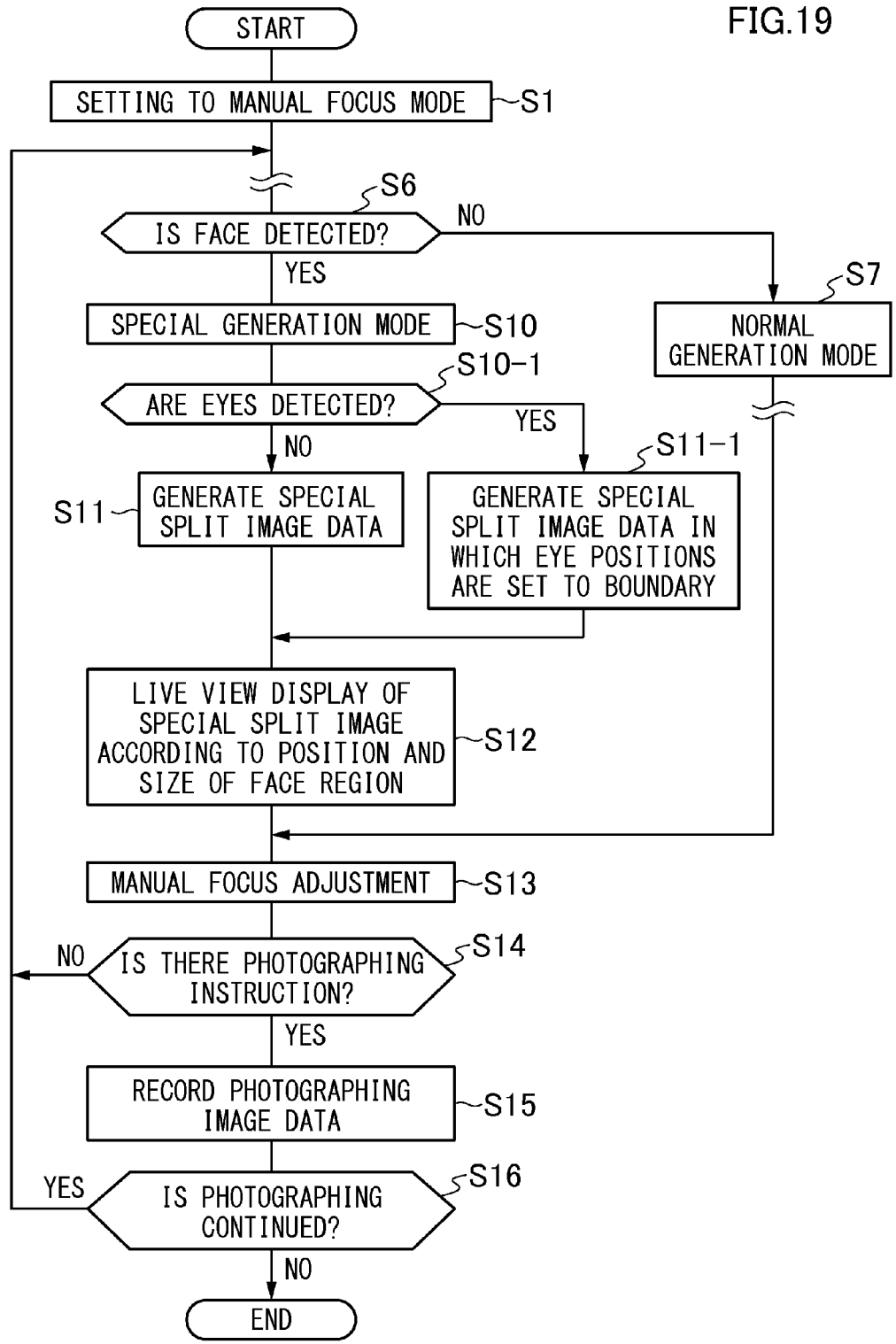
FIG. 19 is a flowchart illustrating the flow of photographing processing of a digital camera of the third embodiment.

The operation of the digital camera 78 of the above-mentioned configuration is described using FIG. 19. Here, since the flow of processing in steps S1 to S10 is the same as the first embodiment illustrated in FIG. 13, a specific explanation is omitted here.

Here, in above-mentioned steps S5 and S6, in a case where eyes are detected at the time of face detection, the face detection unit 53*a* outputs the eye detection information 60*a* showing the positions of these eyes to the split image generation unit 54*a* together with the face detection information 60. Moreover, the face detection unit 53*a* performs face detection processing by the use of other face detection methods than the eye detection method in a case where the eyes are not detected, and outputs only the face detection information 60 to the split image generation unit 54*a*.

<Special Generation Mode: at Non-Detection of Eyes>

In a case where eyes are not detected in the face detection unit 53*a* (NO in step S10-1), the CPU 11 controls the split image generation unit 54*a* to generate the special SI data 66 in a similar way to the first embodiment (step S11). In the following, live view display similar to the first embodiment is performed (step S12).

<Special Generation Mode: at Detection of Eyes>

By contrast, in a case where eyes are detected in the face detection unit 53*a* (YES in step S10-1), the CPU 11 controls the split image generation unit 54*a* to generate both image data 66La and 66Ra respectively corresponding to the upper and lower images of the face region 62 divided with the eye positions based on the eye detection information 60*a* as a boundary (step S11-1). By this means, monochrome special SI data 66*a* with the eye positions as the boundary is acquired. This special SI data 66*a* is temporarily stored in the VRAM region of the memory 13 in a state where position information of the face region 62 is stored in the header or the like in the same way as the first embodiment.

Figure 20:
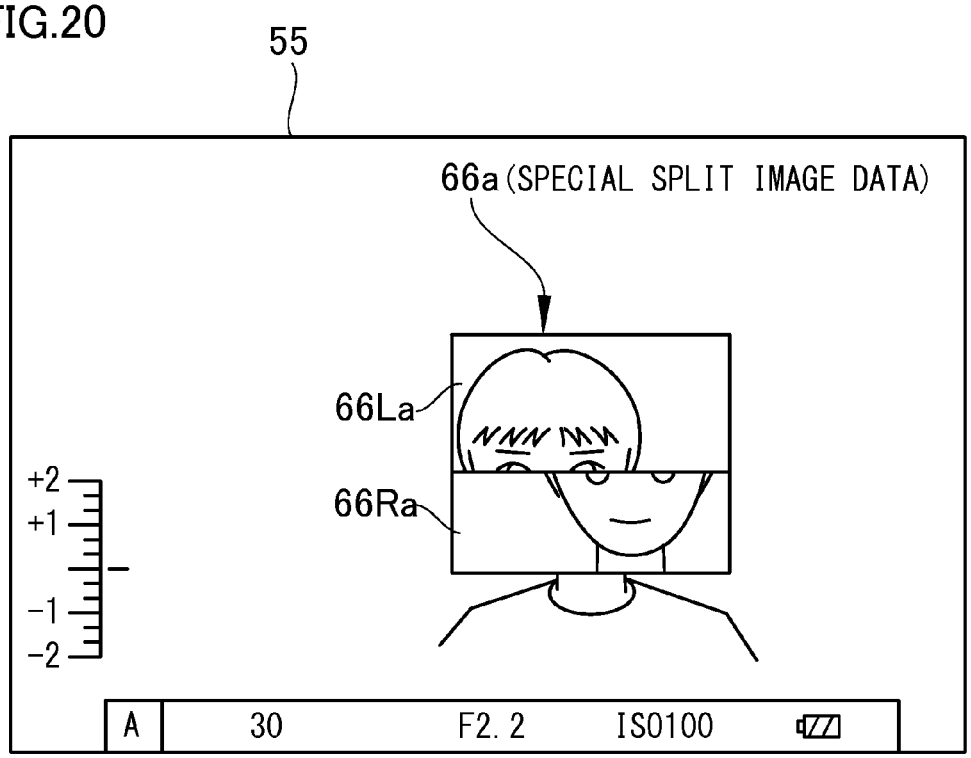
FIG. 20 is an explanatory diagram to describe split image data of the third embodiment.

As illustrated in FIG. 20, after the special SI data 66*a*. is synthesized with the face region 62 of the object image data 55, it is output to the display unit 8. By this means, a live view image in which the monochrome split image with the eye positions as a boundary is synthesized in the full color image is displayed on the display unit 8 (step S12). Here, since processing subsequent to this is basically the same as the first embodiment, explanation is omitted here (see FIG. 13).

Thus, in the digital camera 78 of the third embodiment of the present invention, since it is possible to display a split image divided with the eye positions of a face as a boundary, it becomes easy to focus the eyes of person H.

[Digital Camera of Fourth Embodiment]

Figure 21:
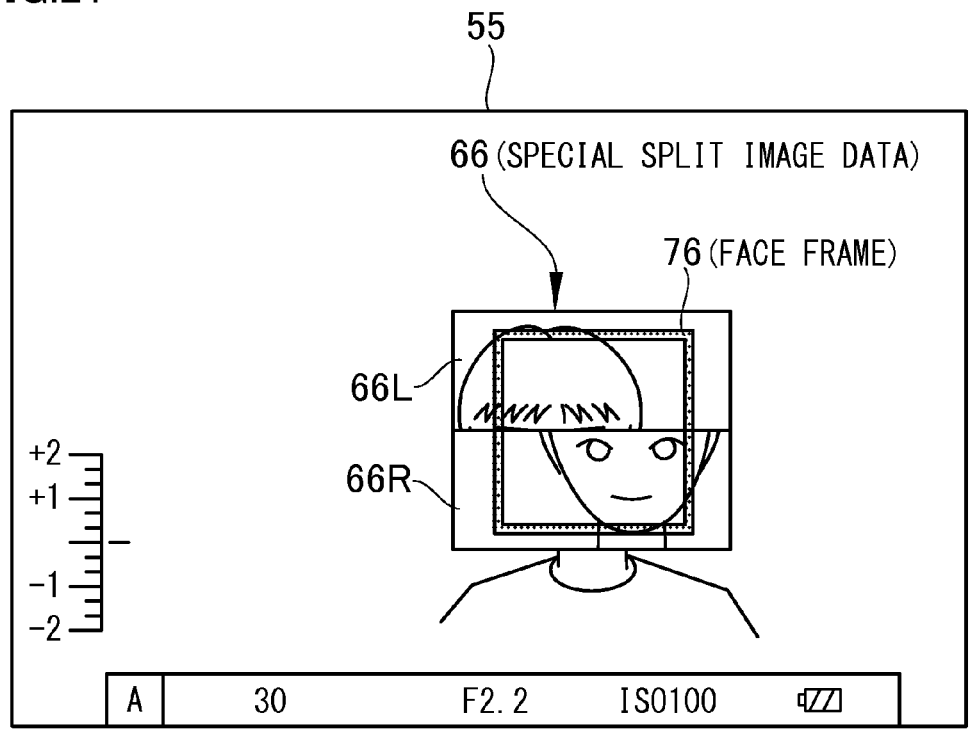
FIG. 21 is an explanatory diagram to describe face frame display of the fourth embodiment.

Next, a digital camera of the fourth embodiment of the present invention is described using FIG. 21. In the above-mentioned second embodiment, the face frame 73 that encloses the special SI data 66 is convoluted and displayed in the display region of the object image data 55. By contrast with this, in the fourth embodiment, a translucent face frame (second object identification frame) 76 that encloses a face image is convoluted and displayed in the display region of the special SI data 66.

The digital camera of the fourth embodiment has basically the same configuration as the digital camera 70 of the above-mentioned second embodiment illustrated in FIG. 15. Therefore, regarding what has the same function/configuration as the above-mentioned second embodiment, the same reference numeral is assigned and explanation thereof is omitted. However, the face frame display unit 72 of the fourth embodiment determines the position and size of a face image in the display region of the special SI data 66 from the face detection information 60 and convolutes and displays a face frame 76 in the display region of the special SI data 66 on the basis of this determination result.

Since the face frame 76 is translucent, even if this face frame 76 is displayed in the display region of the special SI data 66, it is possible to easily understand the position of the face in the special SI data 66. Moreover, it is possible to easily understand the shift amount in the boundary between the both image data 66L and 66R. As a result, similar to the second embodiment, it becomes easy to perform focus adjustment even in a case where the face frame 76 is displayed.

[Digital Camera of Fifth Embodiment]

Figure 22:
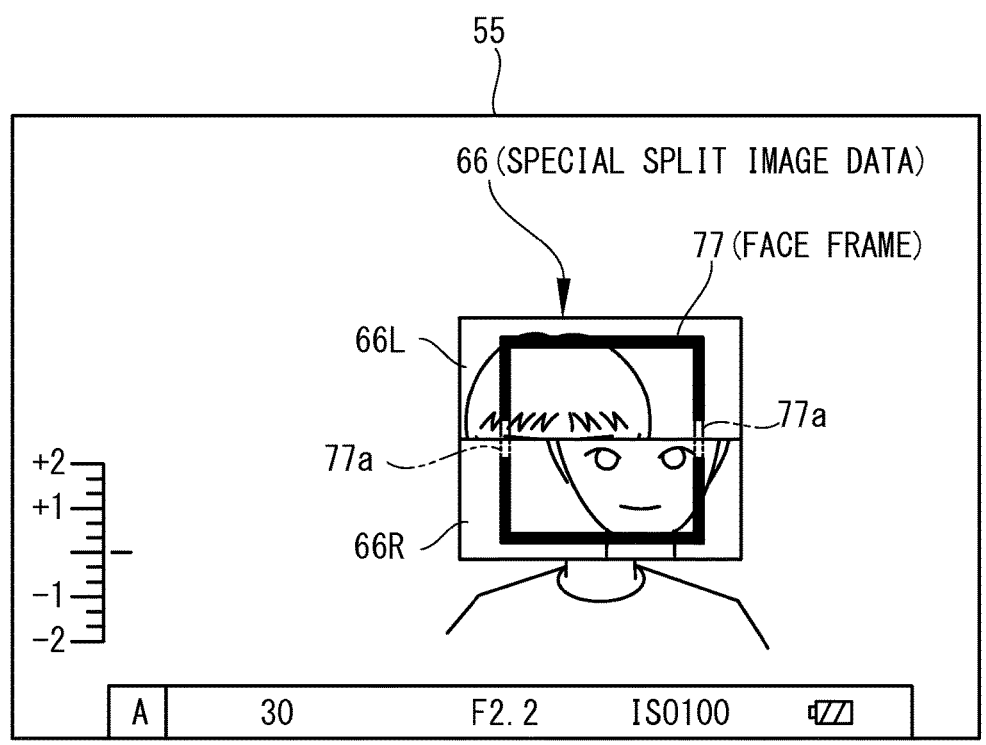
FIG. 22 is an explanatory diagram to describe face frame display of the fifth embodiment.

Next, a digital camera of the fifth embodiment of the present invention is described using FIG. 22. In the digital camera of the above-mentioned fourth embodiment, the face frame 76 is translucently displayed in the display region of the special SI data. 66. By contrast with this, in the digital camera of the fifth embodiment, a face frame different from the face frame 76 is displayed and convoluted in the display region of the special SI data 66.

Similar to the digital camera of the above-mentioned fourth embodiment, the digital camera of the fifth embodiment has basically the same configuration as the digital camera 70 of the above-mentioned second embodiment illustrated in FIG. 15 too. Therefore, regarding what has the same function/configuration as the above-mentioned second embodiment, the same reference numeral is assigned and explanation thereof is omitted. However, the face frame display unit 72 of the fifth embodiment displays a face frame (third object identification frame) 77 that encloses a face image in the display region of the special SI data 66 on the basis of the face detection information 60. In this face frame 77, a part 77*a* across the boundary between upper and lower images based on the both image data 66L and 66R (which is simply referred to as "boundary step part") is transparently displayed. That is, it can be said that the face frame 77 is divided by the boundary between the upper and lower images.

By transparently displaying the boundary step part 77*a* of the face frame 77 in this way, it is possible to easily understand the shift amount in the boundary between the both image data 66L and 66R. As a result, similar to the second and fourth embodiments, it becomes easy to perform focus adjustment even in a case where the face frame 77 is displayed.

[Digital Camera of Sixth Embodiment]

Figure 23:
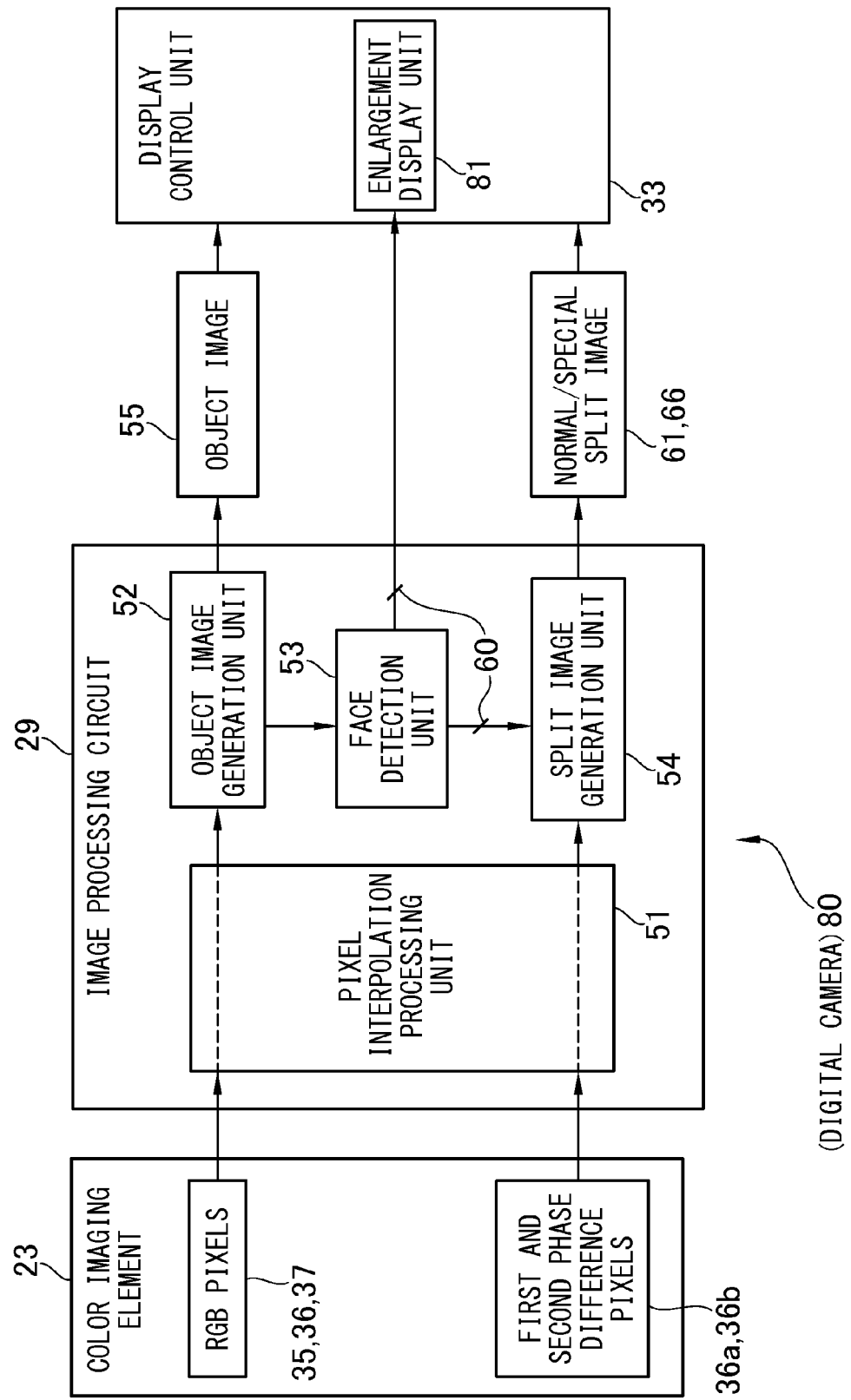
FIG. 23 is a block diagram illustrating the electrical configuration of a digital camera of the sixth embodiment.

Next, a digital camera 80 of the sixth embodiment of the present invention is described using FIG. 23. A case where a face image is detected in the central region 64 by face detection processing has been described in the digital camera of each embodiment mentioned above, but, in the digital camera 80, a face is easily focused even in a case where a face image is detected outside the central region 64.

The digital camera 80 has basically the same configuration as the digital camera 70 of the above-mentioned second embodiment, except for that an enlargement display unit 81 instead of the face frame display unit 72 is included in the display control unit 33. Regarding what has the same function/configuration as the above-mentioned first and second embodiments, the same reference numeral is assigned and explanation thereof is omitted.

Figure 24:
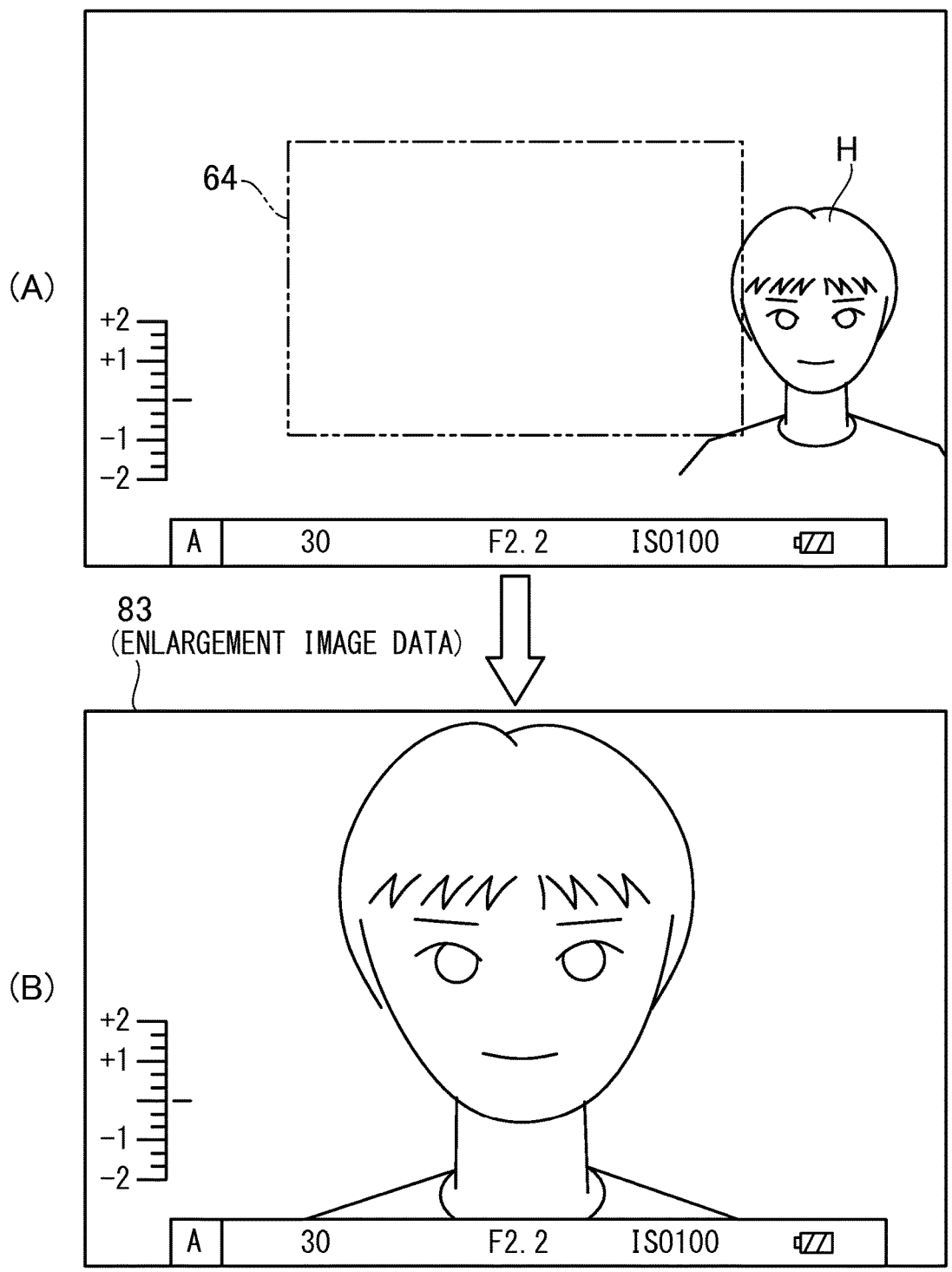
FIG. 24 is an explanatory diagram to describe enlargement display processing of a face region of the sixth embodiment.

As illustrated in part (A) of FIG. 24, the enlargement display unit 81 determines whether the face region 62 locates outside the central region 64, on the basis of the face detection information 60 acquired from the face detection unit 53, and, in a case where this face region 62 locates outside the central region 64, generates enlargement image data 83 enlarging this face region 62 and outputs it to the display unit 8. By this means, as illustrated in part (B) of FIG. 24, the enlargement image of the face region 62 is subjected to live view display on the display unit 8 on the basis of the enlargement image data 83. Here, in this case, the generation of the normal/special SI data 61/66 by the split image generation unit 54 is not performed.

Thus, in the digital camera 80 of the fifth embodiment, since this face region 62 is enlarged and displayed in a case where the face region 62 locates outside the central region 64, it is possible to focus a face while seeing the enlargement image of the face region 62. As a result, it is possible to improve the focusing accuracy even in a case where the special SI data 66 cannot be displayed.

[Digital Camera of Seventh Embodiment]

Figure 25:
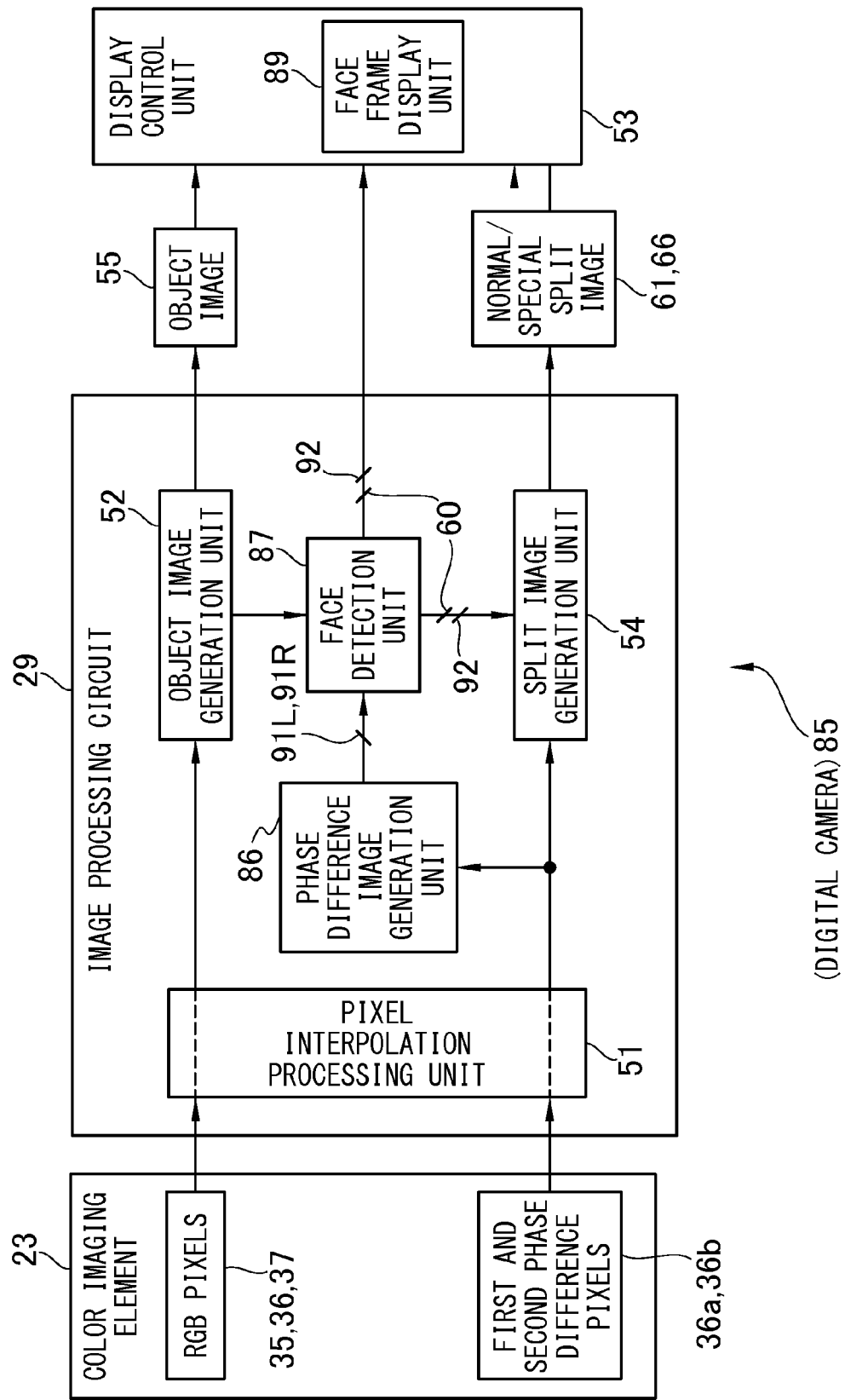
FIG. 25 is a block diagram illustrating the electrical configuration of a digital camera of the seventh embodiment.

Next, a digital camera 85 of the seventh embodiment of the present invention is described using FIG. 25. In each of the above-mentioned second, fourth and fifth embodiments, the face frames 73, 76 and 77 are convoluted and displayed in live view images on the basis of the result of performing face detection processing on the object image data 55 (face detection information 60). By contrast with this, in the digital camera 85, a face frame is convoluted and displayed on a live view image on the basis of the result of performing face detection processing on image data in two viewpoints which are respectively generated from the outputs of the both phase difference pixels 36a and 36b.

The digital camera 85 has basically the same configuration as the digital camera 70 of the second embodiment, except for that a phase difference image generation unit 86, a face detection unit 87 and a face frame display unit 89 are installed instead of the face detection unit 53 and the face frame display unit 72 of the second embodiment. Therefore, regarding what has the same function/configuration as the above-mentioned second embodiment, the same reference numeral is assigned and explanation thereof is omitted.

The phase difference image generation unit 86 generates first phase difference image data 91L when the above-mentioned central region 64 is seen from the L viewpoint side, on the basis of the pixel values of the first phase difference pixel 36a and the interpolation pixel thereof. Moreover, the phase difference image generation unit 86 generates second phase difference image data 91R when the central region 64 is seen from the R viewpoint side, on the basis of the pixel values of the second phase difference pixel 36b and the interpolation pixel thereof. The first and second phase difference image data 91L and 91R correspond to the first image and second image of the present invention which are generated from the outputs of the both phase difference pixels 36a and 36b. These both phase difference image data 91L and 91R are output to the face detection unit 87.

The face detection unit 87 performs face detection processing on each of the both phase difference image data 91L and 91R, and detects the position and size of the face image in each of the both phase difference image data 91L and 91R. Here, since a specific face detection processing method is the same as the face detection processing method by the face detection unit 53 of the above-mentioned first embodiment, a specific explanation is omitted. In a case where face images are detected in both of the both phase difference image data 91L and 91R, the face detection unit 87 outputs the detection result of the positions and size of the face images in both of the both phase difference image data 91L and 91R to the face frame display unit 89 as "right-and-left face detection information 92". This right-and-left face detection information 92 is output even to the split image generation unit 54. The split image generation unit 54 determines the position and the size of the face region 62 on the basis of the right-and-left face detection information 92 and generates the special SI data 66.

Moreover, in a case where a face image is not detected in at least any one of the both phase difference image data 91L and 91R, similar to the face detection unit 53 of the first embodiment, the face detection unit 87 performs face detection processing on the object image data 55 read from the VRAM region of the memory 13. Further, in a case where a face image is detected from the object image data 55, the face detection unit 87 outputs the face detection information 60 to the face frame display unit 89.

Here, even in a case where face images are detected in both of the both phase difference image data 91L and 91R, the face detection unit 87 performs face detection processing on the object image data 55 and outputs the face detection information 60 to the split image generation unit 54. By this means, similar to each above-mentioned embodiment, it is possible to generate the special SI data 66 in the split image generation unit 54.

Figure 26:
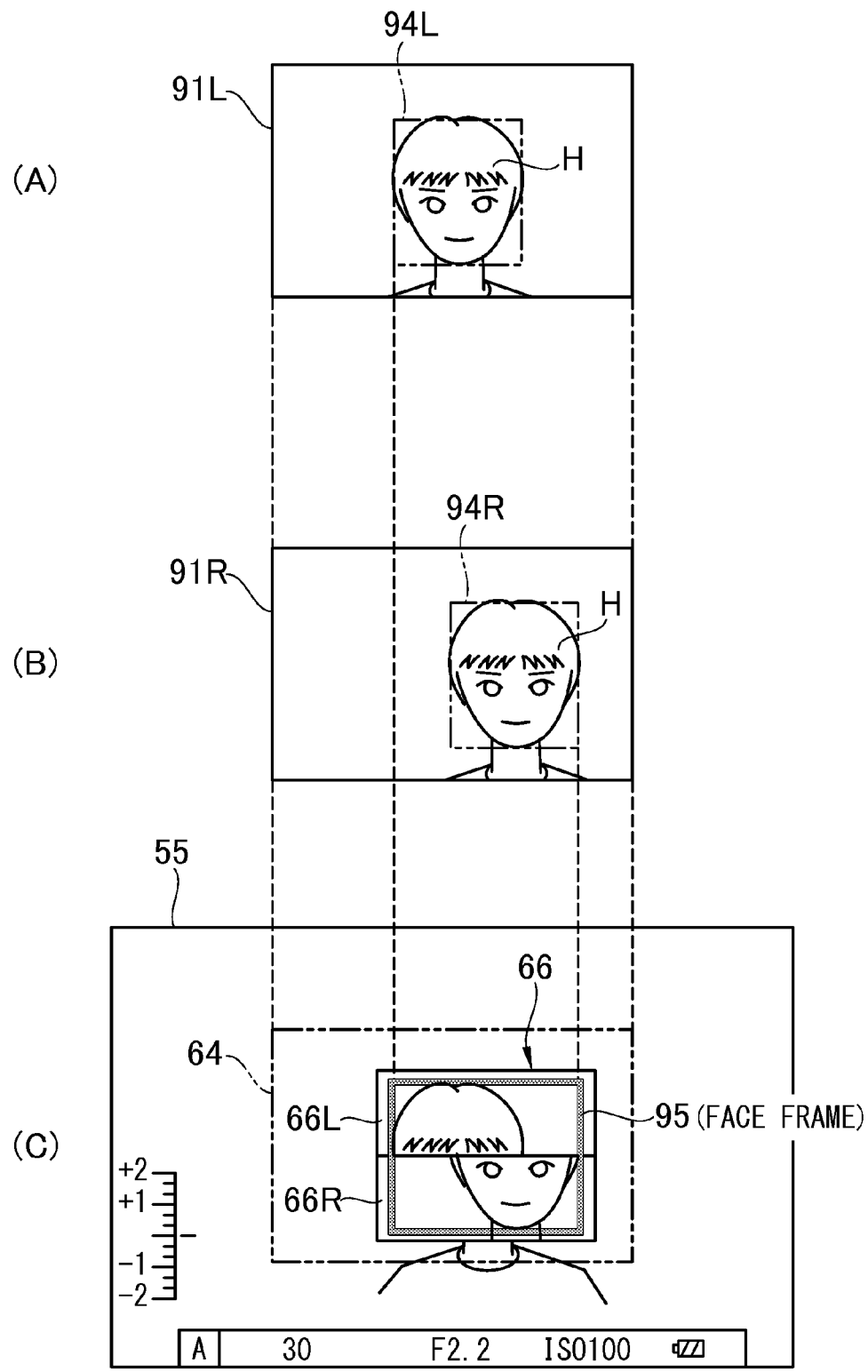
FIG. 26 is an explanatory diagram to describe face frame display of the seventh embodiment.

As illustrated in part (A) of FIG. 26 and part (B) of FIG. 26, in a case where the right-and-left face detection information 92 is input from the face detection unit 87, the face frame display unit 89 determines a first face region 94L and a second face region 94R that enclose face images in the first and second phase difference image data 91L and 91R respectively, on the basis of the right-and-left face detection information.

Next, as illustrated in part (C) of FIG. 26, the face frame display unit 89 convolutes and displays a face frame (fourth object identification frame) 95 that encloses both of each of the face regions 94L and 94R, in the display region of the special SI data 66. A method of deciding this face frame 95 is not especially limited, and, for example, the coordinates of each point in respective frames that enclose respective face regions 94L and 94R may be found to decide a frame including all coordinates as the face frame 95.

Here, in a case where the face detection information 60 is input from the face detection unit 87, the face frame display unit 89 convolutes and displays any of the face frame 73, 76 and 77 in each of the above--mentioned second, fourth and fifth embodiments in a live view image, on the basis of this face detection information 60.

<Operation of Digital Camera of Seventh Embodiment>

Figure 27:
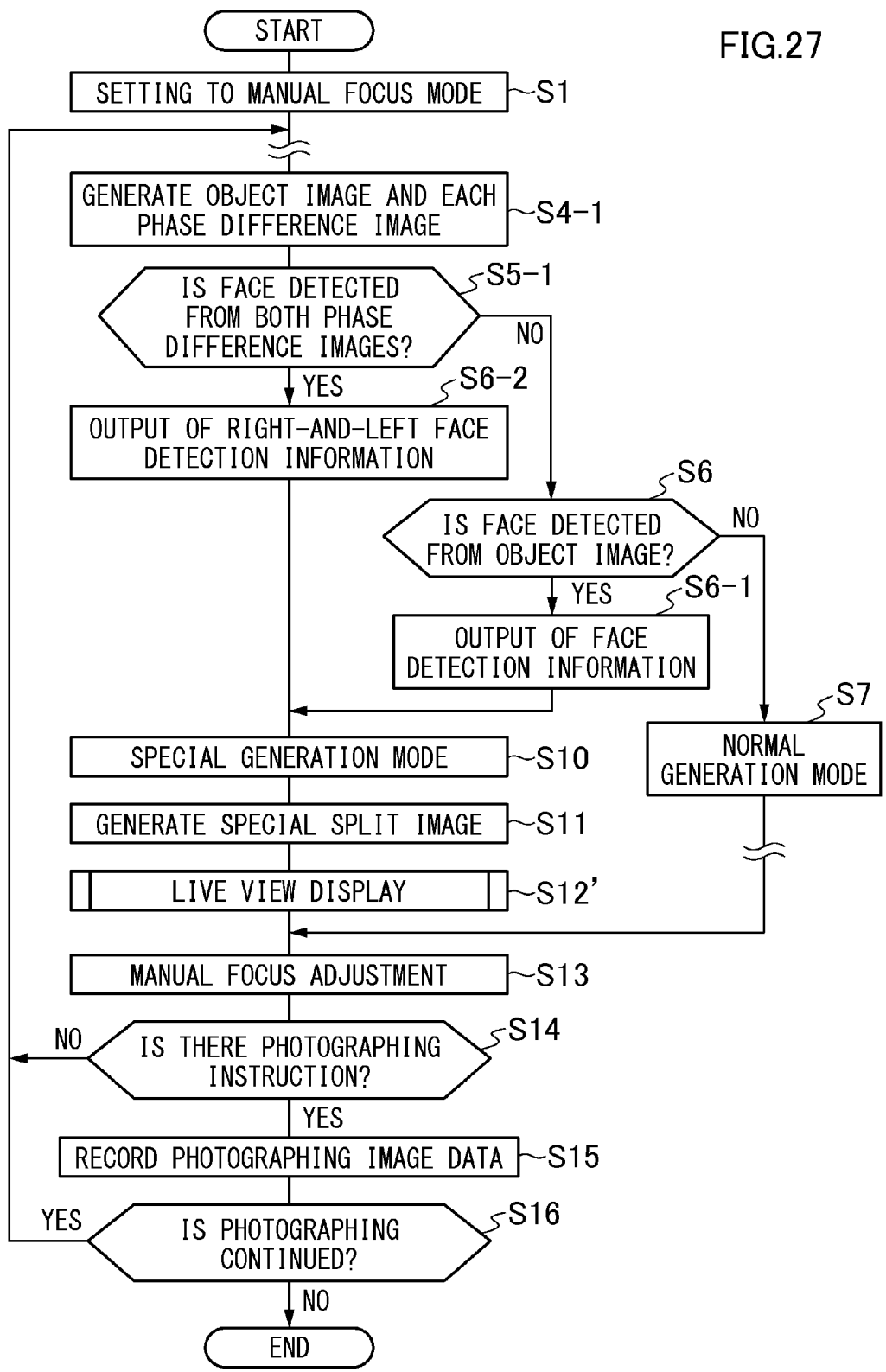
FIG. 27 is a flowchart illustrating the flow of photographing processing of a digital camera of the seventh embodiment.

The operation of the digital camera 85 of the above-mentioned configuration is described using FIG. 27. Here, since the steps up to S3 are the same as the above-mentioned first embodiment illustrated in FIG. 13, a specific explanation is omitted here.

After the end of step S3, the object image generation unit 52 generates the object image data 55 on the basis of the pixel values of the RGB pixels 35 to 37 and interpolation pixels, and stores it in the VRAM region of the memory 13. Moreover, the phase difference image generation unit 86 generates the both phase difference image data 91L and 91R respectively on the basis of the pixel values of the both phase difference pixels 36a and 36b and the interpolation pixels thereof, and outputs them to the face detection unit 87 (step S4-1).

Whenever new both phase difference image data 91L and 91R are input from the phase difference image generation unit 86, the face detection unit 87 performs face detection processing on these both phase difference image data 91L and 91R (step S5-1).

<Face Image is Non-Detected in at Least One of Both Phase Difference Images>

In a case where a face image is not detected in at least any one of the both phase difference image data 91L and 91R (NO in step S5-1), the face detection unit 87 performs face detection processing on the object image data 55 read from the VRAM region of the memory 13 (step S6). Here, in a case where a face image is not detected in the object image data 55 (NO in step S6), each processing in steps S7 to S9 illustrated in FIG. 13 is performed.

Moreover, in a case where a face image is detected in the object image data 55 (YES in step S6), the face detection information 60 indicating the position and size of this face image is output to each of the split image generation unit 54 and the face frame display unit 89 (step S6-1).

<Face Image is Detected in Both of Both Phase Difference Images>

Meanwhile, in a case where face images are detected in both of the both phase difference image data 91L and 91R (YES in step S5-1), the face detection unit 87 outputs the right-and-left face detection information 92 indicating the position and size of each face image to the split image generation unit 54 and the face frame display unit 89 (step S6-2).

<Special Generation Mode>

In a case where a face image is detected in at least the object image data 55 (YES in step S5-1 or step S6), the split image generation unit 54 performs operation in a special generation mode (step S10). The split image generation unit 54 generates the special SI data 66 including the first image data 66L and the second image data 66R on the basis of the face detection information 60 or the right-and-left face detection information 92, and stores it in the VRAM region of the memory 13 (step S11).

<Live View Image Display (step S12')>

Figure 28:
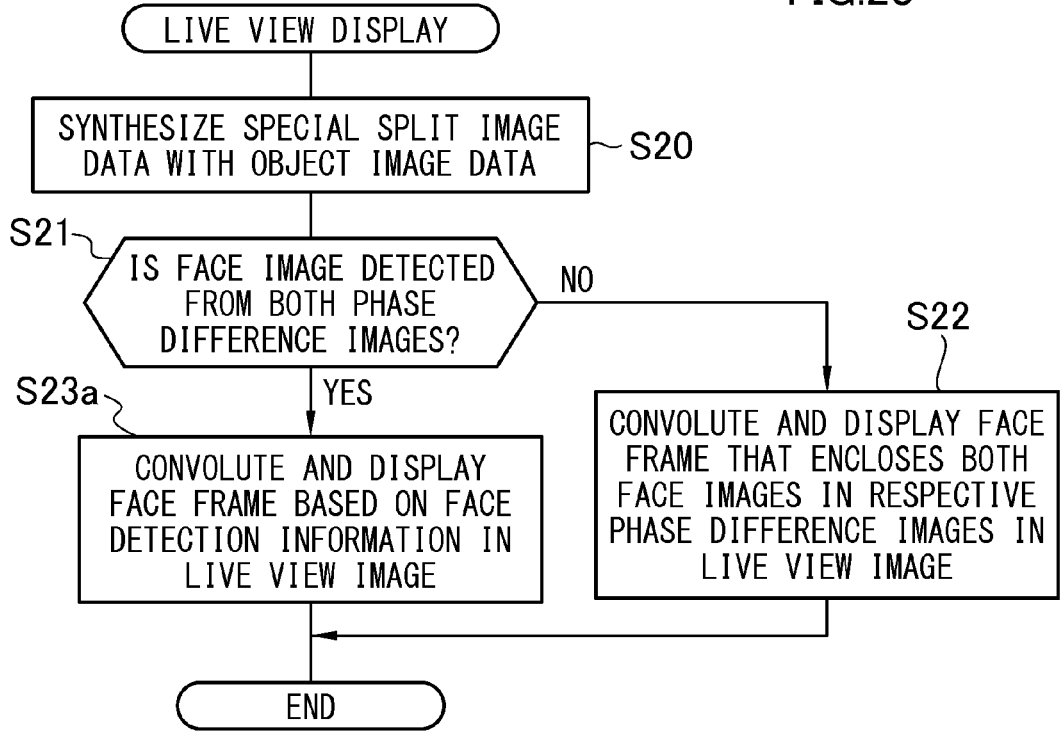
FIG. 28 is a flowchart illustrating the flow of live view display in FIG. 27.

As illustrated in FIG. 28, the display control unit 33 reads the object image data 55 and the special SI data 66 from the VRAM region of the memory 13, and, after synthesizing the special SI data 66 with the face region 62 of the object image data 55, outputs the result to the display unit 8 (step S20). By this means, a live view image in which a monochrome split image corresponding to the position and size of the face region 62 is synthesized in a full color image is displayed on the display unit 8.

At this time, in a case where the face detection information 60 is input from the face detection unit 87, that is, in a case where a face image is not detected in both of the both phase difference image data 91L and 91R (NO in step S21), the face frame display unit 89 convolutes and displays any of the face frames 73, 76 and 77 in each of the above-mentioned second, fourth and fifth embodiments in the live view image on the basis of this face detection information 60 (step S22).

By contrast, in a case where the right-and-left face detection information 92 is input from the face detection unit 87, that is, in a case where a face image is detected in both of the both phase difference image data 91L and 91R (YES in step S21), the face frame display unit 89 determines first and second face regions 94L and 94R in the both phase difference image data 91L and 91R respectively, on the basis of this right-and-left face detection information 92. Next, as illustrated in FIG. 26, the face frame display unit 89 convolutes and displays the face frame 95 that encloses both of each of the face regions 94L and 94R in the display region of the special SI data 66 (step S23).

Returning to FIG. 27, since the flow of processing after this is the same as the first embodiment illustrated in FIG. 13, explanation is omitted here. Here, as the focus lens 16 becomes closer to the focusing position, the phase difference between the both phase difference image data 91L and 91R gradually decreases, and the face frame 95 gradually decreases in response thereto.

Thus, in the digital camera 85 of the seventh embodiment, since the face frame 95 that encloses both of regions in which face images detected in the both phase difference image data 91R and 91L are respectively included is convoluted and displayed in the display region of the special SI data 66, the face frame 95 is prevented from being displayed on the face images in the display region of the special SI data 66 (see part (C) of FIG. 26).

Meanwhile, in above-mentioned FIG. 17 indicating a comparative example, in a case where the face frame 74 that encloses the face image detected from the object image data 55 is convoluted and displayed in the display region of the special SI data 66, there is a risk that this face frame 74 is displayed on the face image. When the face frame 74 is displayed on the face image in this way, since part of the boundary between the face image in the first image data 66L and the face image in the second image data 66R (which is simply referred to as "face image boundary" below) is covered with the face frame 74, there is a risk that it becomes difficult to understand the shift amount in this face image boundary.

By contrast with this, since the face frame 95 is not displayed on a face image in the present invention, it is possible to easily understand the face image boundary. As a result, it becomes easy to perform focus adjustment even in a case where the face frame 95 is displayed.

[Others]

Figure 29:
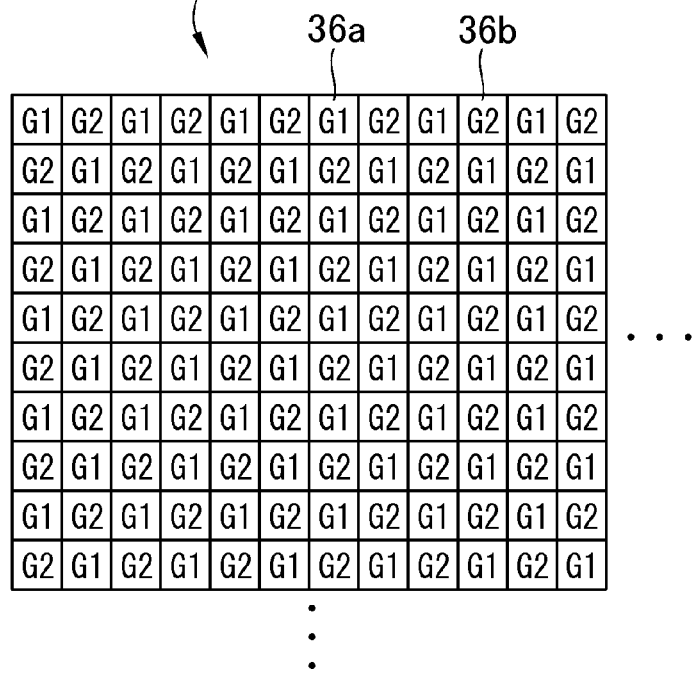
FIG. 29 is a schematic view of the imaging surface of a color imaging element of another embodiment.

At least two of above-mentioned respective embodiments may be arbitrarily combined. Moreover, the RGB pixels 35 to 37 and the both phase difference pixels 36a and 36b are two-dimensionally arrayed on the imaging surface of the color imaging element 23 in above-mentioned respective embodiments, but, for example, as illustrated in FIG. 29, the present invention is applicable even in a case where only the both phase difference pixels 36a and 36b are two-dimensionally arrayed on the imaging surface of the color imaging element 23'. In this case, for example, the object image generation unit 52 calculates an addition pixel value adding the pixel values (outputs) of the both phase difference pixels 36a and 36b that are mutually adjacent, and generates the object image data 55 on the basis of each addition pixel value. Here, since the generation methods of the normal and special SI data 61 and 66 are basically the same as the first embodiment, explanation is omitted.

Moreover, in a case where only the both phase difference pixels 36a and 36b are two-dimensionally arrayed on the imaging surface of the color imaging element 23 as illustrated in FIG. 29 or in a case where the both phase difference pixels 36a and 36b are installed on the imaging surface at a constant rate, the display unit 8 may be caused to display only a split image on the basis of normal/special split image data, In above-mentioned respective embodiments, a case where the RGB pixels 35 to 37 and the both phase difference pixels 36a and 36b are arrayed on the imaging surface of the color imaging element 23 in an array paten illustrated in above-mentioned FIG. 4 has been described, but the array pattern of each of these pixels may be arbitrarily changed.

An explanation has been given where, as the normal and special SI data 61 and 66, the one divided into two in the vertical direction (upper and lower) is exemplified in above-mentioned respective embodiments, the split image data of the present invention includes the one that is displayed as a double image in the case of defocus and clearly displayed in a focusing state when two phase difference images (first image and second image)are convoluted for synthetic display.

For example, the normal and special SI data 61 and 66 may be divided into two in the horizontal direction and divided into two in the oblique direction inclined to the horizontal and vertical directions. Moreover, each of the SI data 61 and 66 may be divided vertically or horizontally in a stripe shape to alternately display the first image data and the second image data. In addition, each of the SI data 61 and 66 may be divided in a lattice shape to arrange and display each of the first image data and the second image data in a checkered pattern (checker pattern).

RGB pixels of three colors have been described as normal pixels in above-mentioned respective embodiments, but, for example, pixels of four colors formed with three primary colors of RGB and another color (for example, emerald (E)) may be possible, and the kind of pixels is not especially limited. Moreover, the present invention is also applicable to pixels of C (cyan), M (magenta) and Y (yellow) that are complementary colors of primary colors RGB.

In above-mentioned respective embodiments, the central region 64 in the display region of the object image data 55 is set as a specific region of the present invention that displays the normal SI data 61, but other regions than this central region 64 may be set as a specific region. In this case, in the digital camera 80 of the above-mentioned sixth embodiment, enlargement display of a face image is performed when the face image is detected outside the specific area.

An explanation has been given in above-mentioned respective embodiments where the face of person H is exemplified as a specific main object of the present invention, but, for example, the present invention is applicable even to a case where various objects such as dogs, cats, cars and airplanes are assumed to be the specific main object. Moreover, the main object is the face and therefore the face frames 73, 76, 77 and 95 (first to fourth object identification frames) are displayed in above-mentioned respective embodiments, but the form or the like of the first to fourth object identification frames may be arbitrarily changed according to the kind of the main object.

An explanation has been given in above-mentioned respective embodiments where a digital camera is exemplified as the imaging device of the present invention, but, for example, the present invention is also applicable to a portable telephone machine, smartphone, PDA (Personal Digital Assistants), tablet computer and portable game machine which have a photograph function. In the following, a detailed explanation is given with reference to the drawings while exemplifying the smartphone.

<Configuration of Smartphone>

Figure 30:
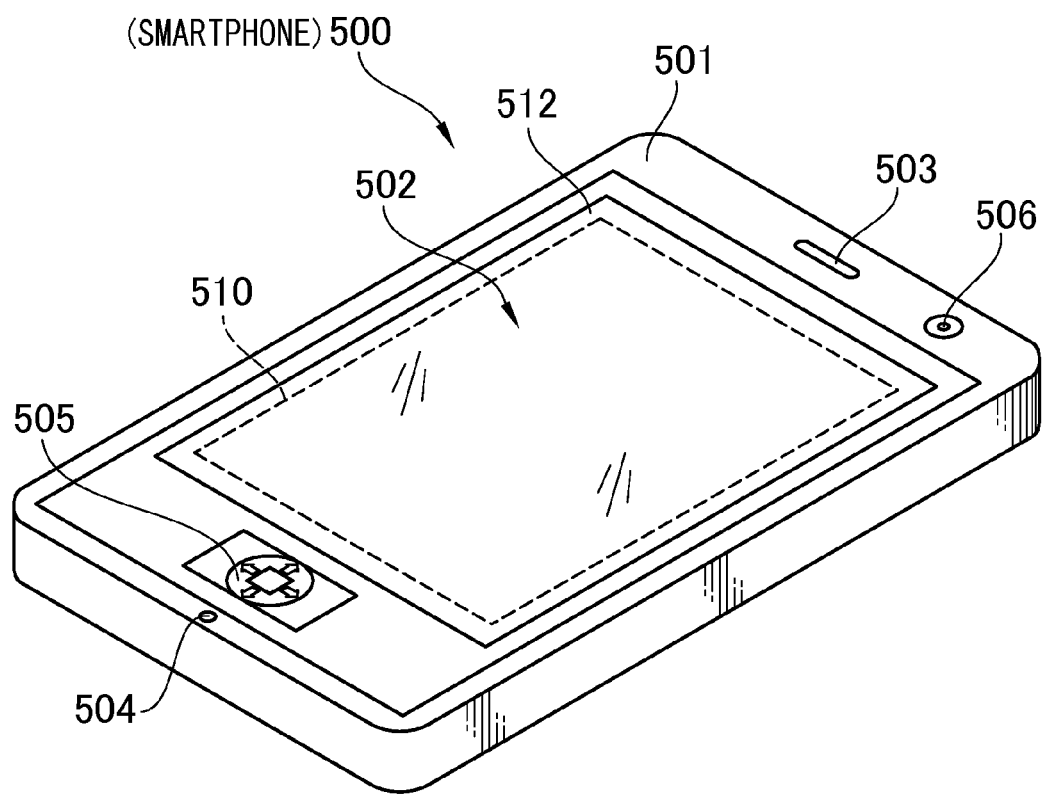
FIG. 30 is a perspective view of a smartphone.

FIG. 30 illustrates the appearance of a smartphone 500. The smartphone 500 has a tabular chassis 501. One surface of the chassis 501 includes a display input unit 502, a speaker 503, a microphone 504, an operation unit 505 and a camera unit 506. Here, the configuration of the chassis 501 is not limited to this, and, for example, it is also possible to adopt a configuration in which the display unit and the input unit are independent or a configuration having a folded structure or sliding mechanism.

The display input unit 502 displays an image (still image and moving image) and character information, and so on, by control of a display processing unit 508 having received an instruction from a CPU 507. Moreover, the display input unit 502 has a so-called touch panel structure to detect user operation with respect to displayed information. This display input unit 502 is configured with a display panel 510 and an operation panel 512.

As for the display panel 510, an LCD (Liquid Crystal Display) and an OELD (Organic Electro-Luminescence Display), and so on, are used as a display device. The operation panel 512 has optical transparency and is placed on the display surface of the display panel 510. This operation panel 512 is a device that detects one or more coordinates operated with user's finger or stylus. When this device is operated by user's finger or stylus, a detection signal generated depending on the operation is output to the CPU of the smartphone 500. The CPU detects the operation position (coordinates) on the display panel 510 on the basis of the received detection signal. In a position detection system adopted in such the operation panel 512, there are a matrix switch system, a resistance film system, a surface elastic wave system, an infrared ray system, an electromagnetic induction system and an electrostatic capacity method, and so on.

Figure 31:
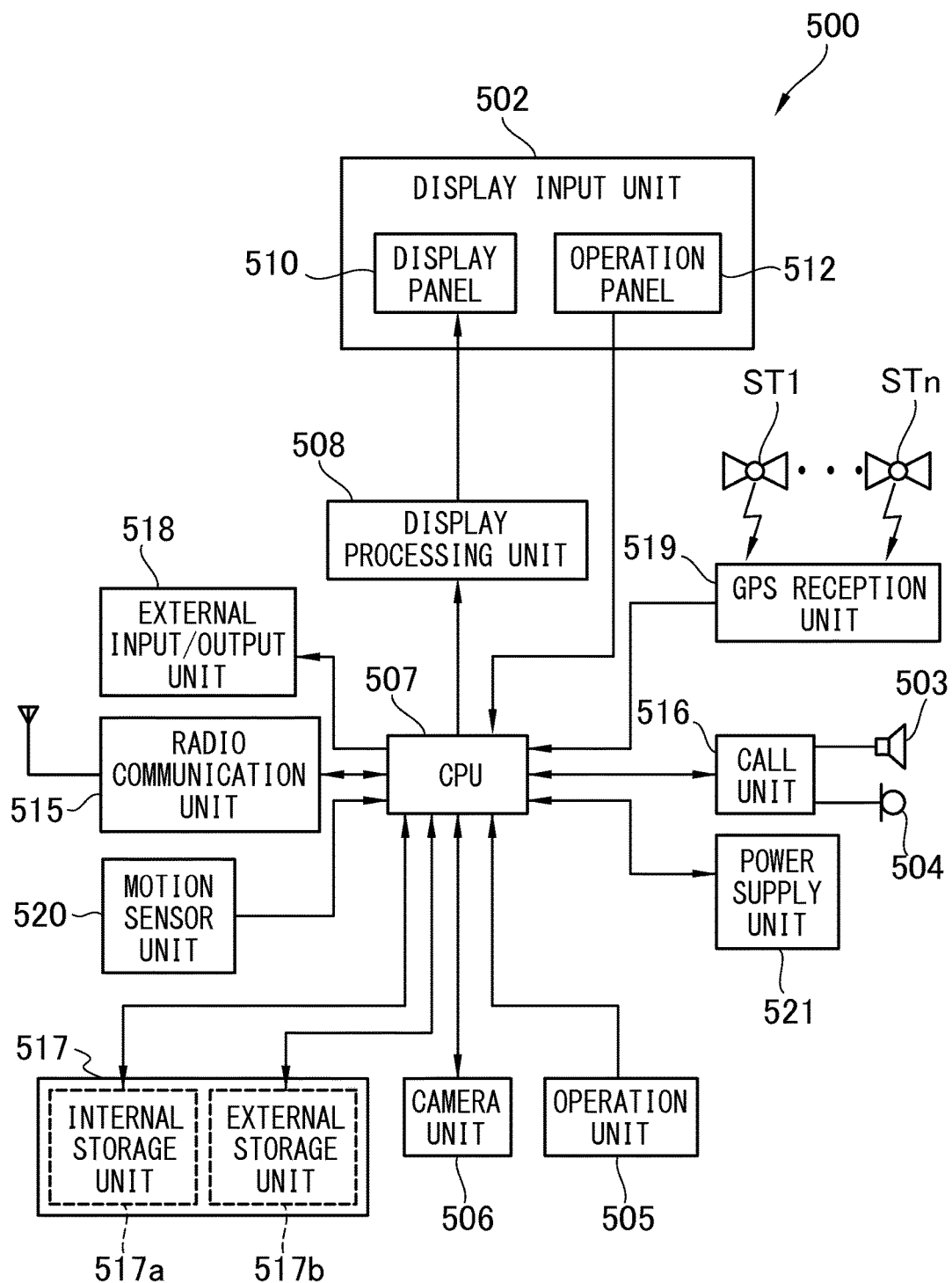
FIG. 31 is a block diagram illustrating the electrical configuration of a smartphone.

As illustrated in FIG. 31, the smartphone 500 includes a radio communication unit 515, a call unit 516, a storage unit 517, an external input/output unit 518, a GPS (Global Positioning System) reception unit 519, a motion sensor unit 520 and a power supply unit 521, in addition to the display input unit 502, the speaker 503, the microphone 504, the operation unit 505, the camera unit 506, the CPU 507 and the display processing unit 508.

The radio communication unit 515 performs radio communication with respect to a base station device housed in a mobile communication network according to an instruction of the CPU 507. This radio communication is used to transmit and receive email data and various kinds of file data such as voice data and image data, and so on, and receive web data and streaming data, and so on.

The call unit 516 includes the speaker 503 and the microphone 504, converts user's voice input through the microphone 504 into voice data and outputs it to the CPU 507, and decodes voice data received in the radio communication unit 515, and so on, and outputs it from the speaker 503.

For example, the operation unit 505 is a hardware key using a press button switch and a cross key, and so on, and accepts an instruction from the user. For example, this operation unit 505 is mounted to the lower side of the display unit of the chassis 501 or the side surface of the chassis 501.

The storage unit 517 stores a control program and control data of the CPU 507, application software, address data associating the name and telephone number, and so on, of the communication party, and data of transmitted and received email data, and so on, or temporarily stores streaming data, and so on. Moreover, the storage unit 517 is formed with an internal storage unit 517a incorporated in the smartphone and an external storage unit 517b having a detachable external memory slot. Here, various known storage media of a flash memory type and hard disk type, and so on, are used as the internal storage unit 517a and the external storage unit 517b.

The external input/output unit 518 plays a role of an interface with all external devices connected with the smartphone 500 and is provided to directly or indirectly connect with other external devices by communication, and so on.

The GPS reception unit 519 receives GPS signals transmitted from GPS satellites ST1 to STn, performs positioning calculation processing based on the received multiple GPS signals, and detects a position formed with the latitude, longitude and altitude of the smartphone 500. This detection result is output to the CPU 507.

For example, the motion sensor unit 520 includes a three-axis acceleration sensor, and so on, and detects the physical movement of the smartphone 500. By this means, the movement direction and acceleration of the smartphone 500 are detected. This detection result is output to the CPU 507. Moreover, the power supply unit 521 supplies power accumulated in an unillustrated battery to each part of the smartphone 500.

The CPU 507 operates according to the control program and control data read out from the storage unit 517, and integrally controls each part of the smartphone 500. Moreover, the CPU 507 performs display control with respect to the display panel 510 and operation detection control to detect user operation through the operation unit 505 or the operation panel 512, and so on.

By execution of the display control, the CPU 507 displays a software key such as an icon and a scroll bar to activate application software, or displays a window to create email. Here, the scroll bar denotes a software key to accept an instruction to move an image display part of a large image that cannot be settled in the display region of the display panel 510.

Moreover, by execution of operation detection control, the CPU 507 detects user operation through the operation unit 505, accepts operation with respect to the above-mentioned icon or an input of a character string with respect to an input column of the above-mentioned window through the operation panel 512 or accepts a scroll request of a display image through a scroll bar.

In addition, the CPU 507 has a touch panel control function to determine whether an operation position with respect to the operation panel 512 is an overlapping part (display region) that overlaps with the display panel 510 or it is the remaining outer peripheral part (non-display region) that does not overlap with the display panel 510 by execution of operation detection control, and controls the sensing region of the operation panel 512 and the display position of the software key. Moreover, the CPU 507 can detect gesture operation with respect to the operation panel 512 and execute a preset function according to the detected gesture operation.

Since the camera unit 506 has basically the same configuration as the digital camera of above-mentioned respective embodiments, the effect similar to above-mentioned respective embodiments is acquired. Here, for example, it only has to perform MF operation in the display input unit 502 or the operation unit 505.

What is claimed is:

1. An imaging device comprising:
    an imaging lens;
    a generation device configured to generate a first display image based on an image signal output from an imaging element having first and second pixel groups in which an object image passing through first and second regions in the imaging lens is pupil-divided and formed, and to generate a second display image used for confirmation of focusing from first and second images based on first and second image signals output from the first and second pixel groups;
    a display device configured to display at least any one of the first and second display images;
    a detection device configured to detect a specific main object image from the first display image;
    a generation control device configured to control the generation device to generate a division image that divides the main object image into plural from the first and second images when the main object image is detected by the detection device, and generate the second display image based on the division image; and
    a display control device configured to control the display device to display the first display image generated by the generation device and display the second display image generated by the generation device in a display region of the first display image, and to display the second display image in a position corresponding to the main object image in the first display image when the main object image is detected by the detection device, wherein:
    the detection device can detect an eye position in the main object image; and
    when the eye position is detected by the detection device, the generation control device controls the generation device to generate a division image that divides the main object image with the eye position as a boundary from the first and second images,
    wherein the display control device displays a third object identification frame that encloses the main object image in the second display image and has a transparent part across a boundary between the first and second images, based on a detection result of the detection device.

2. The imaging device according to claim 1, wherein:
    the imaging element includes the first and second pixel groups and a third pixel group into which an object image passing through the first and second regions enters without pupil division; and
    the generation device generates the first display image from an output of the third pixel group.

3. The imaging device according to claim 1, wherein the display control device displays a first object identification frame that encloses the second display image in the display region, based on a detection result of the detection device.

4. The imaging device according to claim 1, wherein the display control device displays a translucent second object identification frame that encloses the main object image in the second display image, based on a detection result of the detection device.

5. The imaging device according to claim 1, wherein the display control device displays a third object identification frame that encloses the main object image in the second display image and has a transparent part across a boundary between the first and second images, based on a detection result of the detection device.

6. The imaging device according to claim 1, wherein, when the main object image is not detected by the detection device, the display control device displays the second display image in a specific region in the display region.

7. The imaging device according to claim 1, wherein the specific region is a central region of the display region.

8. The imaging device according to claim 1, wherein the detection device detects person's face as the main object image.

9. The imaging device according to claim 1, wherein:
    the imaging lens includes a focus lens;
    a lens movement mechanism that moves the focus lens in an optical axis direction of the imaging lens in response to focus operation is included; and the focus operation includes manual operation.

10. An imaging device comprising:

an imagine lens:

a generation device configured to generate a first display image based on an image signal output from an imaging element having first and second pixel groups in which an object image passing through first and second regions in the imaging lens is pupil-divided and formed, and to generate a second display image used for confirmation of focusing from first and second images based on first and second image signals output from the first and second pixel groups:

a display device configured to display at least any one of the first and second display images;

a detection device configured to detect a specific main object image from the first display image;

a generation control device configured to control the generation device to generate a division image that divides the main object image into plural from the first and second images when the main object image is detected by the detection device, and generate the second display image based on the division image; and a display control device configured to control the display device to display the first display image generated by the generation device and display the second display image generated by the generation device in a display region of the first display image, and to display the second display image in a position corresponding to the main object image in the first display image when the main object image is detected by the detection device, wherein:

the detection device can detect an eye position in the main object image; and when the eye position is detected by the detection device, the generation control device controls the generation device to generate a division image that divides the main object image with the eye position as a boundary from the first and second images, wherein:

the detection device detects the main object image from each of the first and second images; and the display control device displays a fourth object identification frame that encloses both a region corresponding to the main object image in the first image and a region corresponding to the main object image in the second image in the first display image, in the second display image, based on a detection result of the main object image from the first and second images by the detection device.

11. A control method of an imaging device, comprising:

a generation step of generating a first display image based on an image signal output from an imaging element having first and second pixel groups in which an object image passing through first and second regions in the imaging lens is pupil-divided and formed, and generating a second display image used for confirmation of focusing from first and second images based on first and second image signals output from the first and second pixel groups;

a detection step of detecting a specific main object image from the first display image;

a generation control step of generating a division image that divides the main object image into plural from the first and second images in the generation step when the main object image is detected in the detection step, and generating the second display image based on the division image;

a display control step of controlling a display unit to display the first display image generated in the generation step and display the second display image generated in the generation step in a display region of the first display image, and displaying the second display image in a position corresponding to the main object image in the first display image when the main object image is detected in the detection step, wherein:

the detection step can detect an eye position in the main object image; and the generation control step generates a division image that divides the main object image with the eye position as a boundary from the first and second images when the eye position is detected by the detection step, wherein the display control device displays a third object identification frame that encloses the main object image in the second display image and has a transparent part across a boundary between the first and second images, based on a detection result of the detection device.

* * * * *